(12) United States Patent
Craven et al.

(10) Patent No.: US 6,237,127 B1
(45) Date of Patent: May 22, 2001

(54) STATIC TIMING ANALYSIS OF DIGITAL ELECTRONIC CIRCUITS USING NON-DEFAULT CONSTRAINTS KNOWN AS EXCEPTIONS

(75) Inventors: Ted L. Craven, Santa Clara; Denis M. Baylor, San Jose; Yael Rindenau, Cupertino, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/093,817

(22) Filed: Jun. 8, 1998

(51) Int. Cl.$^7$ .............................. G06F 17/50; G06F 1/04; G06F 1/06; G06F 1/08
(52) U.S. Cl. ..................................... 716/6; 703/2; 703/15; 703/19; 716/1; 716/3; 716/5; 716/7; 716/2; 713/500
(58) Field of Search ................................. 703/2; 716/2, 1, 716/3, 5, 6, 7; 713/500

(56) References Cited

U.S. PATENT DOCUMENTS

| 4,698,760 | * | 10/1987 | Lembach et al. | 716/6 |
|---|---|---|---|---|
| 5,210,700 | * | 5/1993 | Tom | 716/6 |
| 5,282,147 | * | 1/1994 | Goetz et al. | 716/2 |
| 5,339,253 | * | 8/1994 | Carrig et al. | 716/6 |

(List continued on next page.)

OTHER PUBLICATIONS

Krishna P. Belkhale et al., "Timing Analysis with Known False Sub Graphs", 1995 IEEE pp. 736–740.*

(List continued on next page.)

*Primary Examiner*—Matthew Smith
*Assistant Examiner*—Jibreel Speight
(74) *Attorney, Agent, or Firm*—Brown Raysman Millstein Felder & Steiner LLP; Jonathan T. Kaplan

(57) ABSTRACT

Exceptions allow a circuit designer, working with a circuit synthesis system, to specify certain paths through the circuit to be synthesized as being subject to non-default timing constraints. The additional information provided by the exceptions can allow the synthesis system to produce a more optimal circuit. A tag-based timing analysis tool is presented, which implements exceptions, and can be used in a synthesis system. A circuit is analyzed in "sections," which comprise a set of "launch" flip flops, non-cyclic combinational circuitry and a set of "capture" flip flops. The tag-based static timing analysis of the present invention is performed in four main steps: preprocessing, pin-labeling, RF timing table propagation and relative constraint analysis. Preprocessing converts the exceptions written by the circuit designer into a certain standard form in which paths through the circuit to be synthesized are expressed in terms of circuit "pins." Pin-labeling causes the particular circuit pins, which are the subject of exceptions, to be marked. During RF timing table propagation, "RF timing tables" with rise and fall times are propagated onto all pins of the circuit section. Rise and fall times in the RF timing tables are based on "timing arcs" describing the delay characteristics of each of the state (flip flop) and combinational (logic gate) devices. Each RF timing table has a tag which indicates: i) a launch flip flop clock, and ii) the exception pins through which the RF timing table has propagated. During relative constraint analysis, each RF timing table at the input to a capture flip flop is analyzed for meeting certain relative constraints. These relative constraints may be either defaults, or the defaults may be modified according to an exception satisfied by the contents of the RF timing table's tag.

13 Claims, 22 Drawing Sheets

U.S. PATENT DOCUMENTS

| | | | | |
|---|---|---|---|---|
| 5,508,937 | * | 4/1996 | Abato et al. | 716/6 |
| 5,535,145 | * | 7/1996 | Hathaway | 703/2 |
| 5,602,754 | * | 2/1997 | Beatty et al. | 716/6 |
| 5,615,127 | * | 3/1997 | Beatty et al. | 716/7 |
| 5,636,372 | * | 6/1997 | Hathaway et al. | 713/500 |
| 5,648,913 | * | 7/1997 | Bennett et al. | 716/6 |
| 5,696,694 | * | 12/1997 | Khouja et al. | 716/5 |
| 5,740,067 | * | 4/1998 | Hathaway | 716/6 |
| 5,864,487 | * | 1/1999 | Merryman et al. | 716/6 |
| 5,910,897 | * | 6/1999 | Dangelo et al. | 716/1 |
| 5,956,256 | * | 9/1999 | Rezek et al. | 716/6 |
| 6,014,510 | * | 1/2000 | Burks et al. | 716/3 |
| 6,023,567 | * | 2/2000 | Osler et al. | 716/6 |

OTHER PUBLICATIONS

IBM Corporation, "Using Special Path Exclusions and Adjusts", Web pages of edition of Eins Timer: User's Guide and Reference, 4th ed., Nov. 26, 1997, 10 pages.*

Krishna P. Belkhale et al., "Timing Analysis with Known False Sub Graphs", 1995 IEEE, pp. 736–740.

IBM Corporation, "Using Special Path Exclusions and Adjusts", Web pages of edition of Eins Timer: User's Guide and Reference, Fourth Edition, Nov. 26, 1997, 10 pages.

* cited by examiner

FIGURE 7

```
for (k = 1; k <= i; ++k) { /* LOOP1 */
    for (q = 1; q <= t_k; ++q) { /* LOOP2 */

RF_table_{k,q}' is given same tag as RF_table_{k,q};

D1 = timing_arc_k(rising,rising);
        D2 = timing_arc_k(falling,rising);

RF_table_{k,q}'. minRT = minimum(
                D1 + RF_table_{k,q}. minRT,
                D2 + RF_table_{k,q}. minFT);

RF_table_{k,q}'. maxRT = maximum(
                D1 + RF_table_{k,q}. maxRT,
                D2 + RF_table_{k,q}. maxFT);

D3 = timing_arc_k(rising,falling);
        D4 = timing_arc_k(falling,falling);

RF_table_{k,q}'. minFT = minimum(
                D3 + RF_table_{k,q}. minRT,
                D4 + RF_table_{k,q}. minFT);

RF_table_{k,q}'. maxFT = maximum(
                D3 + RF_table_{k,q}. maxRT,
                D4 + RF_table_{k,q}. maxFT);

} /* end LOOP2 */
} /* end LOOP1 */
```

FIGURE 9A

Identify groups of intermediate proprocessed exception statements which have the same timing alteration;

For each such group of exception statements, produce a sum-of-products expression, in terms of the pin names in the path specifications, and put these sum-of-products expressions (along with the type of timing alteration) as items on a list called LIST;

/* *LOOP10* */ for (each ITEM on LIST)
{
       SUM_OF_PRODUCTS = get_SOP_portion(ITEM)
       TIMING_ALTERATION = get_timing_alteration(ITEM);
       factor("1", SUM_OF_PRODUCTS, TIMING_ALTERATION);
}

/* Each top-level, non-recursive, call to "factor" by *LOOP10* produces an exception statement or statements which implement REMAINDER with a timing alteration of type TIMING_ALTERATION */
void factor(PROD_2_DATE, REMAINDER, TIMING_ALTERATION)
{
       Divide REMAINDER into groups of a Type 1 and put these groups on a list called LIST1 (Type 1 means that each product term of the group begins with same pin name);

{Group the groups on LIST1 to produce a list called LIST2; The groups on LIST2 are of Type 2; A Type 2 group is one in which all of its groups of Type 1 have the same remainder; Taking the "remainder" of a group of Type1 means removing the first pin name from each of its product terms;}

/* *LOOP11* */ for (each group GROUP_SR on LIST2)
       {
              COM_REMAINDER = the remainder common to all the groups of Type 1 in GROUP_SR;

OR_TERM = the sum of the pin names beginning each group of Type 1 in GROUP_SR;

if (COM_REMAINDER = null set then) {
                    create an exception statement whose path specification
                    implements the following product-of-sums:
                         and(PROD_2_DATE, OR_TERM);

FIGURE 9B

In creating the exception statement, each "sums" term, of the product-of-sums, must become the argument of with the appropriate type of path specifier;

In creating the exception statement, its timing alteration will be of type TIMING_ALTERATION;
}

```
    /* else recursively call "factor" */
    else factor( and(PROD_2_DATE, OR_TERM),
                COM_REMAINDER, TIMING_ALTERATION);

} /* end LOOP11 */

} /* end "factor" */
```

FIGURE 9C

Input exceptions statements from circuit designer:
set_false_path -from { Z Q} -through { A T } -to { B G }
set_false_path -through {D E} -through H
set_multicycle_path -through {T G} -through F Intermediate preprocessed exception statements:
set_false_path -from Z -through A -to B
set_false_path -from Z -through A -to G
set_false_path -from Z -through T -to B
set_false_path -from Z -through T -to G
set_false_path -from Q -through A -to B
set_false_path -from Q -through A -to G
set_false_path -from Q -through T -to B
set_false_path -from Q -through T -to G
set_false_path -through D -through H
set_false_path -through E -through H
set_multicycle_path -through T -through F
set_multicycle_path -through G -through F Identify groups of intermediate preprocessed exception statements with same timing alteration:
group1:
    set_false_path -from Z -through A -to B
    set_false_path -from Z -through A -to G
    set_false_path -from Z -through T -to B
    set_false_path -from Z -through T -to G
    set_false_path -from Q -through A -to B
    set_false_path -from Q -through A -to G
    set_false_path -from Q -through T -to B
    set_false_path -from Q -through T -to G
    set_false_path -through D -through H
    set_false_path -through E -through H group2:
    set_multicycle_path -through T -through F
    set_multicycle_path -through G -through F Produce sum-of-products expressions:
LIST = { "set_false_path", {ZAB + ZAG + ZTB + ZTG + QAB + QAG + QTB + QTG + DH + EH} }, { "set_multicycle_path", {TF + GF} }

FIGURE 9D

_LOOP10_, iteration 1:
ITEM = { "set_false_path", {ZAB + ZAG + ZTB + ZTG + QAB + QAG + QTB + QTG + DH + EH} }

SUM_OF_PRODUCTS = ZAB + ZAG + ZTB + ZTG + QAB + QAG + QTB + QTG + DH + EH

TIMING_ALTERATION = "set_false_path"

"factor" is called with the following arguments:
    REMAINDER = ZAB + ZAG + ZTB + ZTG + QAB + QAG + QTB + QTG + DH + EH

PROD_2_DATE = 1

TIMING ALTERATION = "set_false_path"

LIST1 contains four groups of Type 1:
    LIST1 = { {ZAB + ZAG + ZTB + ZTG} + {QAB + QAG + QTB + QTG} + {DH} + {EH} }

LIST2 contains two groups of Type 2:
    LIST2 = {
        { {ZAB + ZAG + ZTB + ZTG} + {QAB + QAG + QTB + QTG} }
        +
        { {DH} + {EH} }
    }

_LOOP11_, iteration 1:
GROUP_SR = { {ZAB + ZAG + ZTB + ZTG} + {QAB + QAG + QTB + QTG} }

COM_REMAINDER = {AB + AG + TB + TG}

OR_TERM = (Z + Q)

FIGURE 9E

"factor" is called recursively with the following arguments:
REMAINDER = {AB + AG + TB + TG}

PROD_2_DATE = 1 * (Z + Q)

TIMING_ALTERATION = "set_false_path"

LIST1 contains two groups of Type 1:
    LIST1 = { {AB + AG} + {TB + TG} }

LIST2 contains one group of Type 2:
    LIST2 = { {{AB + AG} + {TB + TG}} }

*LOOP11* (of 1st recursion), iteration 1:
GROUP_SR = { {AB + AG} + {TB + TG} }

COM_REMAINDER = {B + G}

OR_TERM = (A + T)

"factor" is called recursively, for 2nd time, with the following arguments:
REMAINDER = {B + G}

PROD_2_DATE = 1 * (Z + Q) * (A + T)

TIMING_ALTERATION = "set_false_path"

LIST1 contains two groups of Type 1:
    LIST1 = { {B} + {G} }

LIST2 contains one group of Type 2 (share null set as common remainder):
    LIST2 = { {{B} + {G}} }

FIGURE 9F

*LOOP11 (of 2nd recursion), iteration 1:*
GROUP_SR = {{B} + {G}}

COM_REMAINDER = { }

OR_TERM = (B + G)

create an exception statement, with a "set_false_path" timing alteration, whose path specification implements the following product of sums:
    1 * (Z + Q) * (A + T) * (B + G)

*LOOP11 (of 2nd recursion) ends and 2nd recursion of "factor" returns to 1st recursion of "factor"*

*LOOP11 (of 1st recursion) ends and 1st recursion of "factor" returns to "factor"*

*LOOP11, iteration 2:*
GROUP_SR = { {DH} + {EH} }

COM_REMAINDER = {H}

OR_TERM = (D + E)

*"factor" is called recursively for 3rd time with the following arguments:*
REMAINDER = {H}

PROD_2_DATE = 1 * (D + E)

TIMING_ALTERATION = "set_false_path"

LIST1 contains one group of Type 1:
    LIST1 = { {H} }

LIST2 contains one group of Type 2:
    LIST2 = { {{H}} }

FIGURE 9G

*LOOP11 (of 3rd recursion), iteration 1:*
GROUP_SR = { {H} }

COM_REMAINDER = { }

OR_TERM = H create an exception statement, with a "set_false_path" timing alteration, whose path specification implements the following product of sums:
    1 * (D + E) * H

*LOOP11 (of 3rd recursion) ends and 3rd recursive call of "factor" returns to "factor"*

*LOOP11 ends and call of "factor" returns*

*LOOP10, iteration 2:*
ITEM = { "set_multicycle_path", {TF + GF} }

TIMING_ALTERATION = "set_multicycle_path"

SUM_OF_PRODUCTS = TF + GF

"factor" is called with the following arguments:
    REMAINDER = TF + GF

PROD_2_DATE = 1

TIMING_ALTERATION = "set_multicycle_path"

In a like manner to that described above, "factor" proceeds to find the product-of-sums "1 * (T + G) * F," and creates an exception statement, with a "set_multicycle_path 2" timing alteration, whose path specification implements "1 * (T + G) * F."

FIGURE 10

Identify groups of intermediate proprocessed exception statements which have the same timing alteration;

For each such group of exception statements, produce a sum-of-products expression, in terms of the pin names in the path specifications, and put these sum-of-products expressions on a list called LIST;

/* *LOOP12* */ for (each SUM_OF_PRODUCTS on LIST)
{
       TIMING_ALTERATION = get_timing_alteration(SUM_OF_PRODUCTS);
       factor_order_indep(SUM_OF_PRODUCTS, TIMING_ALTERATION);
}

/* Each top-level call to "factor_order_indep" by *LOOP12* produces an exception statement or statements which implement SUM_OF_PRODUCTS with a timing alteration of type TIMING_ALTERATION */
void factor_order_indep(SUM_OF_PRODUCTS, TIMING_ALTERATION)
{

> Use standard multi-level logic boolean equation manipulation algorithms to convert SUM_OF_PRODUCTS into a LIST of "possible solutions," where a "possible solution" is a logically equivalent form of SUM_OF_PRODUCTS which is in the form of a sum of a product-of-sums (such boolean equation manipulation algorithms include those resulting from the multi-level logic optimization system of the late 1980's entitled "MIS," from the University of California, Berkeley, Department of Electrical Engineering and Computer Science, by R. Brayton, et al.);
>
> For each possible solution count the total number of "sums" amongst all of its product-of-sums and call this value, for each possible solution, its "metric;"
>
> Choose as the "solution" the possible solution with the smallest metric since a smaller metric means that exception pins will be indicated with a smaller number of different labels;
>
> For each product-of-sums in the chosen solution, create an exception statement, with a timing alteration of type TIMING_ALTERATION, and being sure that each "sums" in a product-of-sums becomes the argument of the appropriate path specifier;

} /* end "factor_order_indep" */

FIGURE 15

Input exceptions statements from circuit designer:
set_false_path -from { Z Q} -through { A * {B + C} } -to Y Convert "-through" to sum-of-products:
set_false_path -from { Z Q} -through { A*B + A*C} -to Y Determine cross product:
set_false_path -from Z -through {A*B} -to Y
set_false_path -from Z -through {A*C} -to Y
set_false_path -from Q -through {A*B} -to Y
set_false_path -from Q -through {A*C} -to Y Substitute single-pin "-through"s for products to produce intermediate preprocessed exception statements:
set_false_path -from Z -through A -through B -to Y
set_false_path -from Z -through A -through C -to Y
set_false_path -from Q -through A -through B -to Y
set_false_path -from Q -through A -through C -to Y

FIGURE 16

Preprocessed exception statements resulting from second-way preprocessing:
set_false_path -through {Q + Z} -through {A + T} -through {B + G}
set_false_path -through {N + M} -through {B + G}

Pattern-matching higher-level exception statements:
set_false_path -through { {Q + Z}*{A + T} + {N + M} } -through {B + G}

STATIC TIMING ANALYSIS OF DIGITAL ELECTRONIC CIRCUITS USING NON-DEFAULT CONSTRAINTS KNOWN AS EXCEPTIONS

FIELD OF THE INVENTION

The present invention relates generally to the static timing analysis of digital electronic circuits. More specifically, the present invention relates to analyzing certain paths of a circuit under non-default timing constraints known as exceptions.

BACKGROUND OF THE INVENTION

To tackle the increasing complexity of digital electronic circuits, designers need faster and more accurate methods for statically analyzing the timing of such circuits, particularly in light of ever-shrinking product development times.

The complexity of designing such circuits is often handled by expressing the design in a high-level hardware description language (HLHDL).

HLHDLs allow the designer to save design time by permitting him or her to express the desired functionality at the register transfer level (RTL) of abstraction or higher. The high-level HDL description is then converted into an actual circuit through a process, well known to those of ordinary skill in the art as "synthesis," involving translation and optimization.

HLHDLs describe, directly or indirectly, the two main kinds of circuit entities of an RTL circuit description: i) state devices or sequential logic which store data upon application of a clock signal, and ii) combinational logic. The state devices typically act as either: i) an interface between conceptually distinct circuit systems, or ii) storage for the results of functional evaluation performed by the combinational logic.

In the process of digital circuit design, static timing analysis is often useful in order to verify that the design produced, in addition to being functionally correct, will perform correctly at the target clock speeds. For similar reasons, it would be useful to apply, as efficiently as possible, static timing analysis to the synthesis process.

SUMMARY OF THE INVENTION

The present invention may be used in the hardware synthesis environment known as the "Design Compiler shell" produced by Synopsys, Inc., of Mountain View, Calif.

Exceptions can be a very powerful tool for guiding the Design Compiler portion of the Design Compiler shell towards the synthesis of a more efficient final circuit netlist. This is because exceptions allow the designer, for example, to inform Design Compiler that despite default timing constraints, certain paths through the circuit are subject to less demanding performance requirements in the context of the design's actual application. Exceptions are also useful for further analysis, by the designer, of the final circuit netlist produced by Design Compiler.

Exceptions are specified by the circuit designer as individual syntactic units called "exception statements" which are comprised of a "timing alteration" and a "path specification." The timing alteration instructs the timing analyzer how to alter the default timing constraints for paths through the circuit to be analyzed which satisfy the path specification. The path specification consists of one or more "path specifiers," with each path specifier taking an "argument." In order for a path specification to be satisfied, each argument of each of its path specifiers must be satisfied.

The static timing analysis of the present invention is performed upon units of the circuit, referred to as "sections", which comprise a set of "launch" flip flops, non-cyclic combinational circuitry and a set of "capture" flip flops.

The section to be analyzed is represented by a netlist of flip flops and combinational logic connected together, at their pins, by wire objects.

The tag-based static timing analysis of the present invention, implementing exceptions statements, is performed in four main steps: preprocessing, pin-labeling, RF timing table propagation and relative constraint analysis. Each of these four steps can be accomplished in one of two main ways, depending upon how exception statements are to be implemented.

For a first-way of implementing exception statements, these four steps are referred to as: first-way preprocessing, first-way pin-labeling, first-way modified RF timing table propagation and first-way modified relative constraint analysis.

For a second-way of implementing exception statements, these four steps are referred to as: second-way preprocessing, second-way pin-labeling, second-way modified RF timing table propagation and second-way modified relative constraint analysis.

Preprocessing accepts the exception statements written by the circuit designer and converts them into a set of preprocessed exceptions statements which has their path specifications expressed in a certain standard form. Both first-way and second-way preprocessing convert the path specification of an exception statement into a form expressed literally in terms of pins of the circuit description netlist. For the first-way of implementing exception statements, each pin is specified independently in the path specifications by being its own path specifier argument. For the second-way of implementing exception statements, a group of pins may be specified as being logically equivalent, in terms of their ability to satisfy a path specification, by their being grouped into an OR-type path specifier argument.

In pin-labeling, the pins of the circuit network, specifically referred to by the preprocessed exception statements, are marked to indicate their being the subject of an exception statement or statements.

In first-way pin labeling, each pin, referred to by a preprocessed exception statement, is marked with an "exception flag."

In second-way pin labeling, each pin, referred to by a preprocessed exception statement, is given an "argument container" which can contain a collection of "labels." A label in an argument container is a copy of the "form" in which a preprocessed exception statement has referred to the circuit pin to which the argument container is attached. The purpose of a label is to provide a data item which can be matched against the argument of a path specifier in a preprocessed exception statement. Any form of label, which allows this matching to be accomplished, is suitable. For those path specifier arguments which refer only to a single pin, a label which can match that single-pin reference is put in the argument container. For those path specifier arguments which refer to an OR-expression of several pins, a label which can represents, and can therefore match, the entire OR-expression is put in the argument container.

RF timing table propagation is accomplished as follows.

Delays between the inputs and outputs of either state or combinational devices are represented by "timing arcs." For the purposes of the set of launch flip flops, we are interested in the delay between a clock edge being applied to the flip flop and a subsequent change, if in fact such a change is caused to occur, at the flip flop's outputs. For the purposes of combinational logic, we are interested in the delay between a change being applied to an input of the logic and a subsequent change, if in fact such a change is caused to occur, at the output.

The RF timing tables propagated are comprised of the following four values: minimum rise time (minRT), maximum rise time (maxRT), minimum fall time (minFT) and maximum fall time (maxFT). RF timing tables each have their own "tag" which, in accordance with the present invention, has two parts: i) a first part which is loaded with a unique identifier for the clock of a launch flip flop, and ii) a second part which can contain a variety of "labels" (described below).

The RF timing tables, for a section of circuitry to be analyzed, are initially created as follows. An RF timing table is created for every output of every launch flip flop. The values for minRT, maxRT, minFT and maxFT of each RF timing table are determined from the timing arc from the flip flop's clock to the output of the flip flop for which the RF timing table is being created. A first part of the tag created for each RF timing table is loaded with an identifier indicating the particular clock driving the clock input of the flip flop for which the RF timing table is being created.

At this point, first-way modified RF timing table propagation checks to see if any of the output pins of the launch flip flops have an exception flag. For each output pin with an exception flag, a label, representing that pin as the only argument of a path specifier, is added to the second part of the tag for the RF timing table for that output pin.

At this same point, second-way modified RF timing table propagation checks to see if any of the output pins of the launch flip flops have argument containers. For each output pin with an argument container, all of the labels in that container are added to the second part of the tag for the RF timing table for that output pin.

Propagation of the tagged RF timing tables, through the combinational units of a circuitry section, is accomplished as follows. Each RF timing table, at each input of a combinational unit, is modified, according to the timing arc associated with that input, to produce a temporary RF timing table pointed to by the combinational unit's output pin. Each temporary RF timing table is initially given the same tag as the RF timing table, at the combinational unit's input, it is based upon.

Once all temporary RF timing tables have been computed at the combinational unit's output, those having tags of the same "type" are combined to produce a final RF timing table.

At this point, after the creation of each final RF timing table, first-way modified RF timing table propagation checks to see if the output pin of the combinational unit has an exception flag. If the exception flag exists, then a label, representing that output pin as the only argument of a path specifier, is added to the second part of the tag for the final RF timing table for that output pin if that label, by itself or in conjunction with any selection of labels already on the tag, satisfies, or can possibly satisfy, a path specification of at least one of the preprocessed exception statements.

At this same point, after the creation of each final RF timing table, second-way modified RF timing table propagation checks to see if the output pin of the combinational unit has an argument container. If the argument container exists, then each label in it is considered for possible addition to the second part of the tag for the final RF timing table of the output pin. A label is added to the second part of the tag for the final RF timing table for that output pin if that label, by itself or in conjunction with any selection of labels already on the tag, satisfies, or can possibly satisfy, a path specification of at least one of the preprocessed exception statements. For second-way modified RF timing table propagation, the label may be either: i) a representation of that output pin as the only argument of a path specifier, or ii) a representation of an OR-expression of several pins, of which the output pin is one, as the argument of a path specifier.

Propagation of an RF timing table across a wire, to the input pin of a combinational unit or capture flip flop, is accomplished as follows. The RF timing table, which we shall refer to as "RFTT_input_pin," created at the input pin of a combinational unit or capture flip flop has its rise and fall time values delayed by the wire across which it has just traveled. For first-way modified RF timing table propagation, the pin to which RFTT_input_pin is attached is checked for an exception flag. If an exception flag is found, a label may be added to the second part of the tag of RFTT_input_pin, but only after the same determination is made according to the same procedure described above with respect to the point after the creation of an final RF timing table at a combinational unit output. For second-way modified RF timing table propagation, the pin to which RFTT_input_pin is attached is checked for an argument container. If an argument container is found, a label may be added to the second part of the tag of RFTT_input_pin, but only after the same determination is made according to the same procedure described above with respect to the point after the creation of an final RF timing table at a combinational unit output.

Generally, first-way and second-way modified relative constraint analysis both proceed as follows. Every RF timing table, which we shall refer to as C_FF1_RF_TABLE, at the input of every capture flip flop, which we shall refer to as C_FF1, is looped over. For each RF timing table C_FF1_RF_TABLE, the capture clock driving it, which we shall refer to as C_CLOCK1, is identified. Based upon the launch clock identified in the first part of the tag for C_FF1_RF_TABLE, and capture clock C_CLOCK1, a pair of default relative constraints are identified. These two default relative constraints are called the maximum allowable path delay (MAPD) and the shortest allowable path delay (SAPD). Based upon the labels contained in the second part of the tag for C_FF1_RF_TABLE, a set of preprocessed exception statements, which we shall refer to as C_FF1_EXCEPS, may have their path specifications satisfied. A variety of precedence rules, either user-specified and/or predetermined, are then applied such that a single exception statement, with a single timing alteration, is selected. The timing alteration of this single selected exception statement is then applied to alter the default values of either MAPD and/or SAPD. Finally, the values of C_FF1_RF_TABLE are determined to have met, or not met, its corresponding pair of MAPD (modified or unmodified, depending upon exceptions) and/or SAPD (modified or unmodified, depending upon exceptions): minRT and minFT of C_FF1_RF_TABLE must be greater than SAPD, and maxRT and maxFT of C_FF1_RF_TABLE must be less than MAPD.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 7 depicts, in part, the general propagation of RF timing tables from a gate's inputs to its outputs in pseudo code (based on the C Programming Language);

FIGS. 9A–B presents a procedure in accordance with the present invention for determining, as part of a second phase of second-way preprocessing, for order dependent "-through"s, product-of-sums expressions;

FIGS. 9C–G present a simulation, step-by-step, of the execution of the first phase of second-way preprocessing and second phase of second-way preprocessing as described in FIGS. 9A–B;

FIG. 10 presents a procedure for determining product-of-sums expressions for order independent "-through"s ;

FIG. 15 depicts an example of the exception statement input language augmented to accept an arbitrary boolean equation as the argument of a "-through" path specifier and its subsequent processing according to a modification of the first phase of second-way preprocessing; and FIG. 16 illustrates a specific example of finding higher-level equivalency between pins by further processing preprocessed exception statements to produce an additional set of pattern-matching higher-level exception statements.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Figure 1:
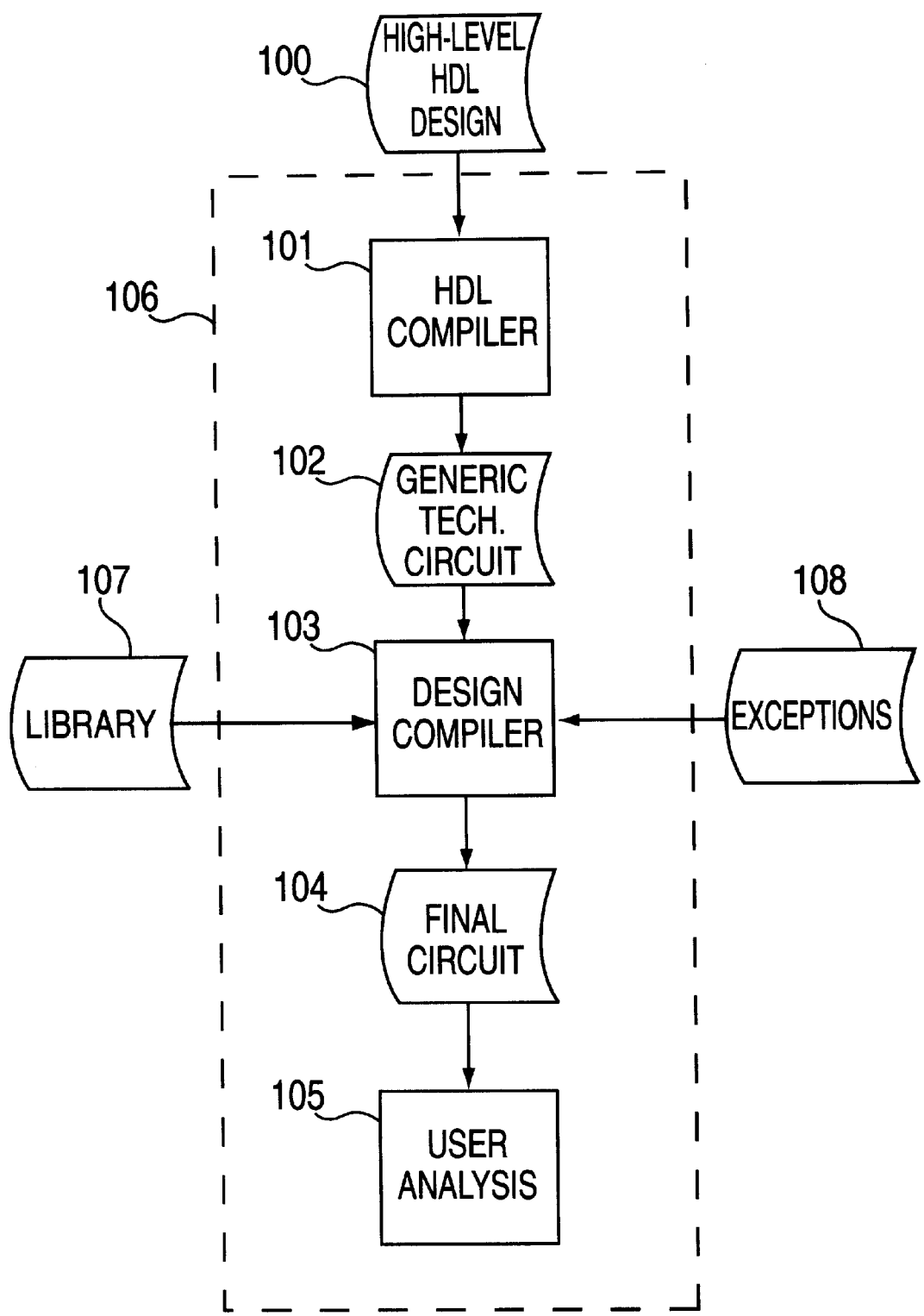
FIG. 1 depicts an overview of the design environment utilizing the principles of the present invention.

The present invention may be used in the hardware synthesis environment known as the "Design Compiler shell" produced by Synopsys, Inc., of Mountain View, Calif. An overview of this design environment is shown in FIG. 1. Design Compiler shell 106, is shown as being composed, from a functional perspective, of major subsections 101 to 105. These major subsections will now be described.

HDL Compiler 101 translates a high-level description of a circuit to be implemented (high-level HDL Design 100), which has been described in the standard HLHDL such as VHDL (for example VHDL Institute of Electrical and Electronic Engineers Standard 1076-1993, herein incorporated by reference) or Verilog HDL (for example Verilog Institute of Electrical and Electronic Engineers Standard 1364-1995, herein incorporated by reference), into a generic technology circuit netlist 102. The HLHDL input is organized into high-level sections known a "blocks."

Design Compiler 103 then translates, automatically, the generic technology circuit description into an optimized implementation in a particular circuit technology (final circuit netlist 104). Design Compiler accomplishes this translation in accordance with: i) the technology dependent cell library 107 selected by the designer (discussed below), and ii) designer specified constraints 108 (also discussed below). Design Compiler accomplishes this translation and optimization in four main steps: i) technology independent optimization, ii) technology mapping, iii) timing correction and iv) area recovery. Technology independent optimization is accomplished by performing transformations on the initial generic technology circuit which result in an optimized generic technology circuit. The initial part of technology independent optimization uses the timing analyzer of the present invention to calculate the worst case constraint on each critical path. In the course of performing technology independent optimizations, however, another form of timing analysis is used which is faster than the present invention but does not take into account exceptions. The goal of technology independent optimization is area minimization, but timing analysis is used to keep the circuit produced closely enough within the worst case constraint on each critical path such that any timing violations introduced during technology independent optimization can be corrected in the subsequent step of timing correction. Technology mapping matches pieces of the generic technology circuit description with "cells" that are available in a particular technology-dependent cell library 107. Cell libraries are typically of two main types: gate array library or standard cell library. The cells of the cell library are implemented in a specific circuit technology (such as CMOS, BiCMOS, bipolar, ECL or NMOS). Technology mapping, like technology independent optimization, uses another form of timing analysis which is faster than the present invention but does not take into account exceptions. Like technology independent optimization, technology mapping also uses the timing analyzer of the present invention only initially in order to calculate the worst case constraint on each critical path. The goal of technology mapping is area minimization, but timing analysis is used to keep the circuit produced closely enough within the worst case constraint on each critical path such that any timing violations introduced during technology mapping can be corrected in the next step of timing correction. Timing correction identifies timing violations, with respect to user-specified constraints 108, or with respect to constraints due to the cell library chosen, and then corrects them by performing local transformations. The transformations used by timing correction do not change the design from being composed of cells from the selected cell library 107. Timing violations are identified during timing correction by utilizing the timing analyzer of the present invention. Finally, area recovery is performed to produce the final circuit description. The designer may specify, as part of constraints 108, the maximum area desired for the final circuit description. Area recovery determines whether timing correction may have introduced a violation of this maximum area constraint. If area recovery finds such a violation, it will perform local transformations in an effort to bring the design within the maximum area desired. The transformations used by area recovery do not change the design from being composed of cells from the selected cell library 107. During area recovery, the timing analyzer of the present invention is utilized to prevent timing violations from being introduced. Connecting to all of these four stages is the "timing backbone" which contains the timing analyzer of the present invention.

The final circuit description 104 may then be subjected to further analysis by the designer (user analysis 105), in order to explore aspects of the final circuit's performance which may not have been directly addressed by Design Compiler.

Constraints 108 allow the user to specify the following three types of constraints: i) the maximum area desired (as discussed above), ii) timing constraints and iii) boundary constraints. Timing constraints are of two main types: waveforms and exceptions.

"Waveforms" are user-specified clock waveforms which are applied to certain points of the circuit design. Waveforms may be applied to the circuit design at either the HLHDL level (of high-level HDL design 100) or at the level of generic technology circuit 102.

At the HLHDL level, in a language such as VHDL or Verilog HDL, the design hierarchy is expressed in terms of "blocks" connected together by "ports." Therefore, at the HLHDL level waveforms would be applied to certain ports.

At the level of generic technology circuit 102, the circuit design is specified in terms of a netlist. A netlist is a connection-oriented description of a circuit. In general, a netlist is comprised of a collection of "device objects" which have connection points called "pins." The pins of the device objects are connected together by "wire objects" which create electrical nodes. In the case of the present invention, the device objects are of two types: those which represent flip flops and those which represent combinational logic. Design Compiler shell 106 provides an interface by which the designer can ascertain the names of various pins in generic technology circuit 102. Waveforms, known as clocks, can then be applied to the desired pins.

In choosing the shapes of the waveforms, and their relationships to each other, the designer has chosen certain timing constraints for the circuit to be synthesized and these implied timing constraints shall be referred to as "default" timing constraints. Exceptions allow the designer to alter these default timing constraints for specific paths through the circuit design. As with waveforms, exceptions may be specified at the HLHDL level in terms or ports or at the generic technology level in terms of pins.

Boundary constraints specify when signals should arrive at, or leave from, certain points in the design with respect to a user-specified waveform or waveforms. As with waveforms and exceptions, boundary constraints may be specified at the HLHDL level in terms or ports or at the generic technology level in terms of pins.

Exceptions can be a very powerful tool for guiding the Design Compiler 103 towards the synthesis of a more efficient final circuit 104. This is because exceptions allow the designer, for example, to inform Design Compiler that despite the default timing constraints, certain paths through the circuit are subject to less demanding performance requirements in the context of the design's actual application.

Exceptions are also used during user analysis 105 in which the final circuit netlist 104 is further analyzed by the designer. In this case, since the designer is working with a lower level description of the design, the exceptions are specified in terms of paths through certain pins of the technology-specific cells selected. Exceptions can also be specified in terms of technology-specific cells. A use of exceptions at this stage of the design process, for example, is to allow the designer to investigate how paths, other than the critical paths, meet the circuit's timing constraints. Exceptions accomplish this by allowing the designer to specify, for example, that the critical paths have greater than default timing constraints and thereby cause other paths in the final circuit to be analyzed as the "critical" path.

The static timing analysis of the present invention is performed upon units of the circuit, referred to as "sections", which comprise: i) a set "L_FFS" of "launch" flip flops, ii) non-cyclic combinational circuitry and iii) a set "C_FFS" of "capture" flip flops. The launch flip flops are driven by a set "L_CLOCKS" of launch clocks, while the capture flip flops are driven by a set "C_CLOCKS" of capture flip flops. The sets L_CLOCKS and C_CLOCKS may have any degree of intersection, from being identical sets to being totally disjoint.

The section to be analyzed is represented, as discussed above, by a netlist of flip flops and combinational logic connected together, at their pins, by wire objects.

The static timing analysis of the present invention, when performed without an implementation of exceptions, is accomplished in two main phases: propagation of tagged rise-fall (RF) timing tables (explained below) and relative constraint analysis (explained below).

Propagation of tagged RF timing tables proceeds as follows.

Firstly, delays between the inputs and outputs of state or combinational devices are represented by "timing arcs." For the purposes of the set of launch flip flops, L_FFS, we are interested in the delay between a clock edge being applied to the flip flop and a subsequent change, if in fact such a change is caused to occur, at the flip flop's outputs. Therefore, we are interested in two timing arcs: i) the arc from the clock input of the flip flop to its "Q" output, and ii) the arc from the clock input to the "-Q" output.

Figure 2A:
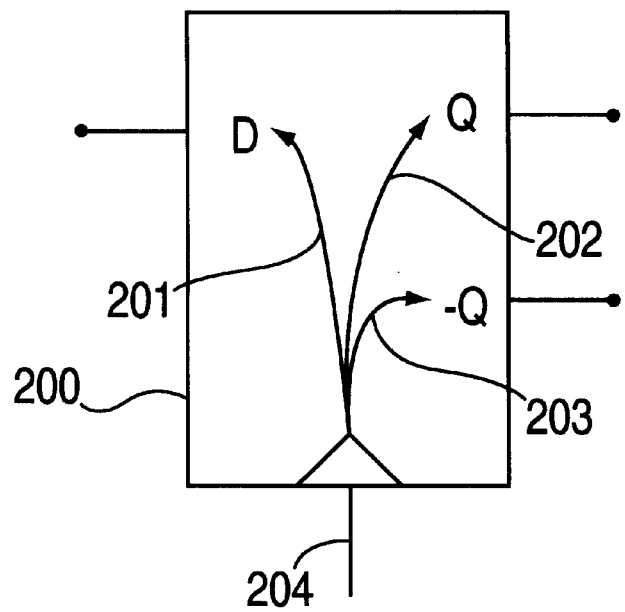
FIGS. 2A–B render timing arcs, as utilized in accordance with the present invention, for a D-type flip flop.
Figure 2B:
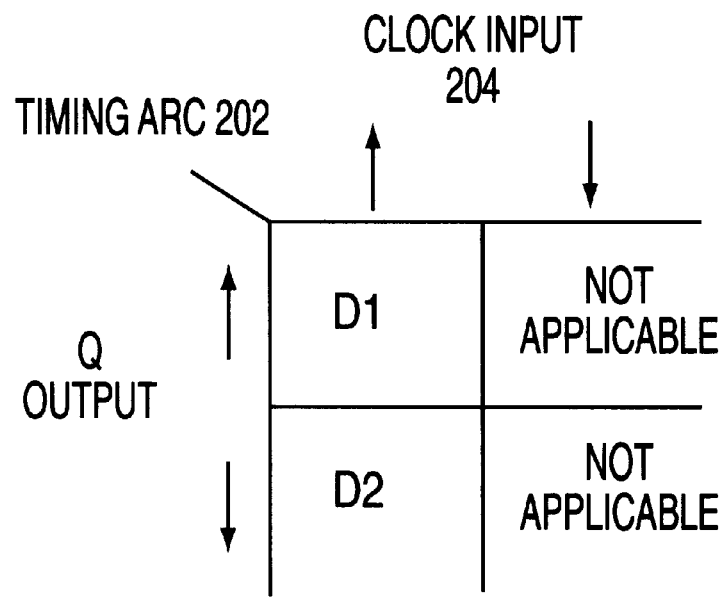

FIG. 2A depicts a D-type flip flop 200 with a positive edge-triggered input 204. Timing arc 202 represents the delay between a positive edge being applied to 204 and the Q output changing either high or low. Likewise, timing arc 203 represents the delay between a positive edge being applied to 204 and the –Q output changing to either high or low. Timing arc 201 represents the setup and hold time required, for the D input, upon the application of a positive edge to 204. Timing arc 202 is represented by a timing arc table, such as that shown in FIG. 2B. The horizontal axis of FIG. 2B represents the positive and negative edges which can be applied to the clock input 204, while the vertical axis represents the transitions possible for output Q. Since flip flop 200 is positive edge-triggered, the negative edge is not applicable to the issue of timing. Upon application of a positive edge, however, we see from the table that the Q output can transition, depending upon the level of the D input and the previous state of the flip flop, to either a high value or a low value. The delay between the application of a positive edge and a transition to a high value of Q is D1, while the delay between the application of a positive edge and a transition to a low value of Q is D2. Timing arc 203 would be represented by a similar table.

Figure 3A:
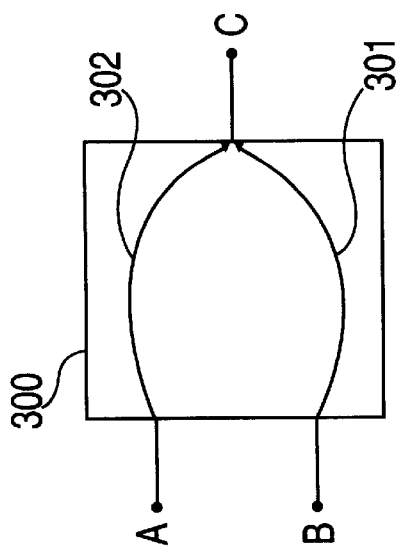
FIGS. 3A–C illustrates timing arcs, as utilized in accordance with the present invention, for a combinational gate.

Delays between the inputs and outputs of combinational devices are represented by timing arcs as shown in FIG. 3. Gate 300 of FIG. 3A is intended to represent any combinational gate with two inputs (A and B) and one output (C). The delay between a transition on input A causing a transition on output C, if such a transition is in fact caused to occur, is represented by timing arc 302 and the delay between a transition on input B causing a transition on output C, if such a transition is in fact caused to occur, is represented by timing arc 301.

Figure 3C:
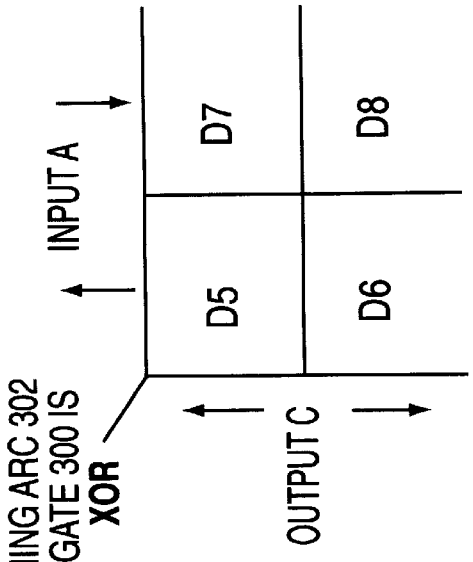
Figure 3B:
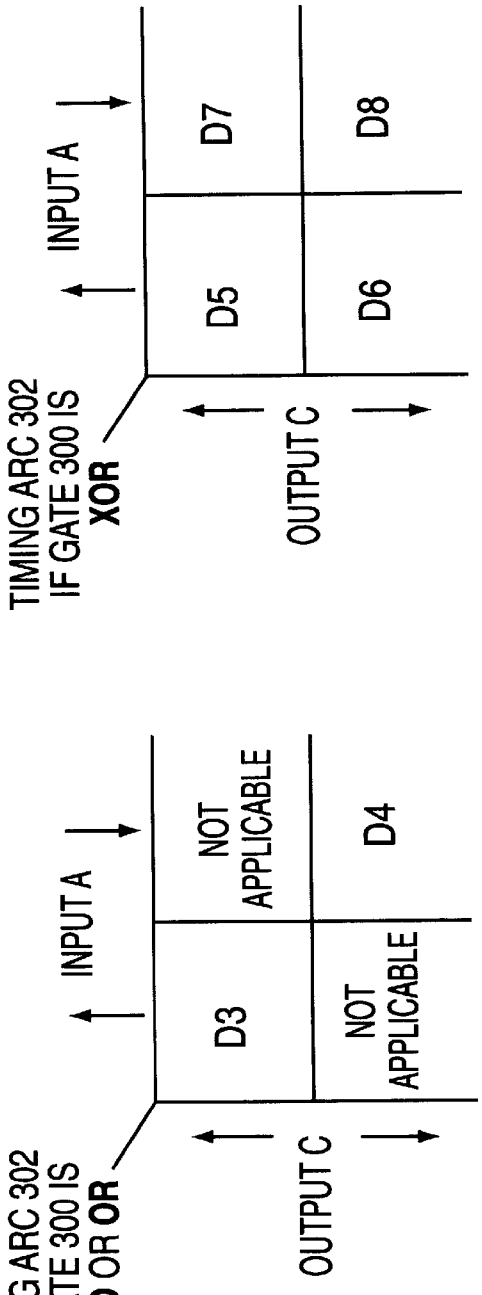

If we assume that gate 300 is either a 2-input AND or OR function, then timing arc 302 can be represented by the timing arc table of FIG. 3B. The horizontal axis of FIG. 3B represents the positive and negative transitions which can be applied to input A, while the vertical axis represents the transitions possible for output C. Upon application of a positive-going transition to input A, we see from the table that, if in fact this transition on input A causes a transition at output C, then the C output will transition to a high value and with a delay of D3. Since the gate is non-inverting, a negative-going transition on input A cannot cause a positive-going transition of C and so this entry in the timing arc table is not applicable. However, a negative-going transition of input A, if it does in fact cause a transition of output C, will cause a negative-going transition of output C and with a delay of D4. A positive-going transition of input A cannot cause a negative-going transition of output C and so this entry in the timing arc table is not applicable.

If we assume that gate 300 is an XOR function, then timing arc 302 can be represented by the timing arc table of FIG. 3C. The horizontal and vertical axes of FIG. 3C have the same meaning as in FIG. 3B. In this case, however, we see that a positive-going transition on input A will cause either a negative-going transition of output C with a delay of D6 or a positive-going transition of output C with a delay of D5. Whether the positive-going transition on input A causes a positive-going or negative-going transition of output C depends upon the state of input B. Likewise, a negative-going transition on input A will cause either a negative-going transition of output C with a delay of D8, or positive-going transition of output C with a delay of D7. Once again, whether the negative-going transition on input A causes a positive-going or negative-going transition of output C depends upon the state of input B.

The RF timing tables propagated are comprised of the following four values: minimum rise time (minRT), maximum rise time (maxRT), minimum fall time (minFT) and maximum fall time (maxFT).

The RF timing tables, for a section of circuitry to be analyzed, are initially created as follows. An RF timing table is created for every output of every launch flip flop. The values for minRT, maxRT, minFT and maxFT of each RF timing table are determined from the timing arc from the flip flop's clock to the output of the flip flop for which the RF timing table is being created. The tag for each RF timing table is loaded with an identifier indicating the particular clock driving the clock input of the flip flop for which the RF timing table is being created.

In general, assume we have a flip flop "L__FF1" which is an element of L__FFS and L__FF1 is driven at its clock pin "L__FF1/CLOCK" by a clock "L__CLOCK1" which is an element of L__CLOCKS. An RF timing table, which shall be referred to as "RF__TABLE__FF1__Q", is determined as follows. Output pin Q of L__FF1 shall be referred to as "L__FF1/Q." The timing arc from L__FF1/CLOCK to L__FF1/Q shall be referred to as "L__FF1__TA." From the timing arc table for L__FF1__TA, the delays associated with L__FF1/Q rising are determined. The minimum of these delays is the value of minRT for RF__TABLE__FF1__Q, while the maximum of these delays is the value of maxRT for RF__TABLE__FF1__Q. From the timing arc table for L__FF1__TA, the delays associated with L__FF1/Q falling are determined. The minimum of these delays is the value of minFT for RF__TABLE__FF1__Q, while the maximum of these delays is the value of maxFT for RF__TABLE__FF1__Q. RF__TABLE__FF1__Q is given a "tag" which contains an identifier that uniquely determines L__CLOCK1 as being connected to L__FF1/CLOCK.

In general, a "tag" is a data structure, pointed to by an RF timing table, which contains an identifier (which we shall also refer to as a "label") that uniquely determines the clock driving the flip flop for which the RF timing table was created.

Figure 4A:
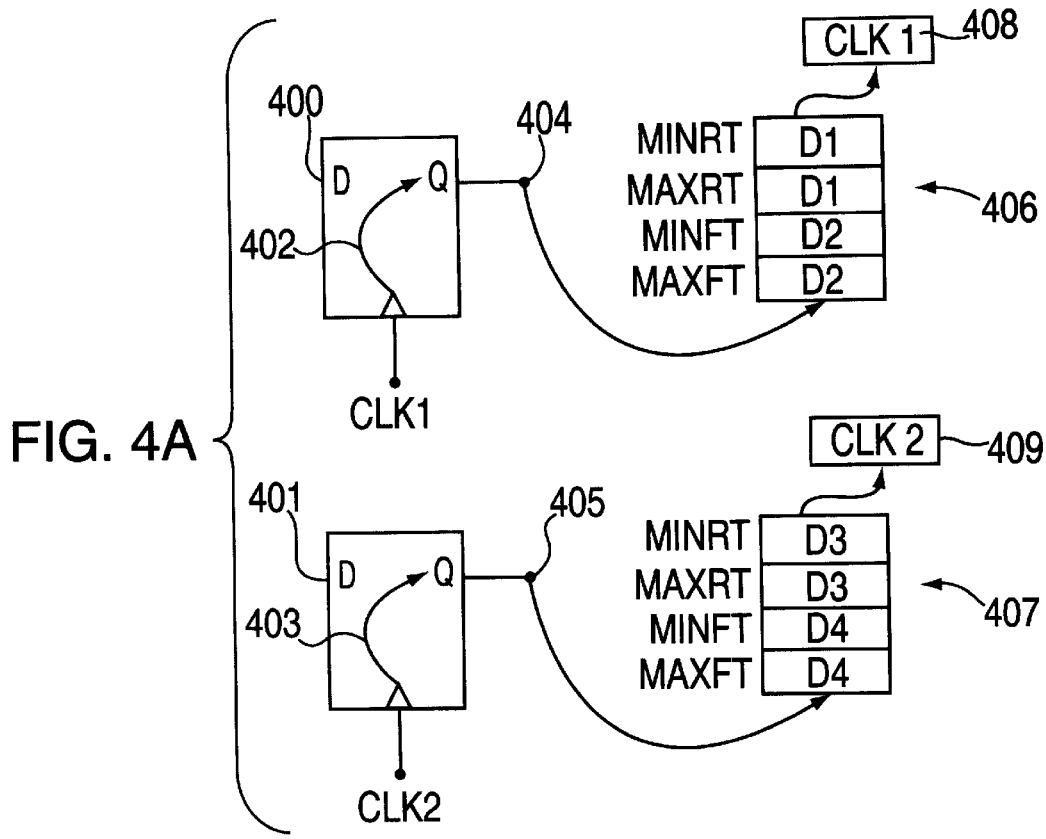
FIGS. 4A–C depict the initial determination of RF timing tables, as utilized in accordance with the present invention, for D-type flip flops.
Figure 4B:
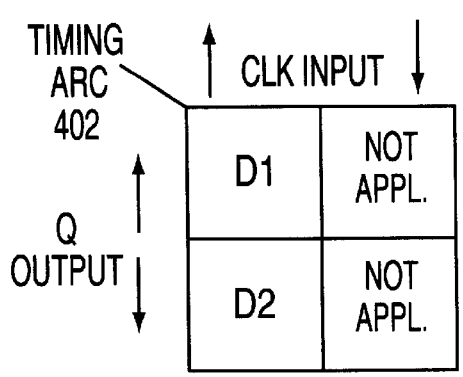
Figure 4C:
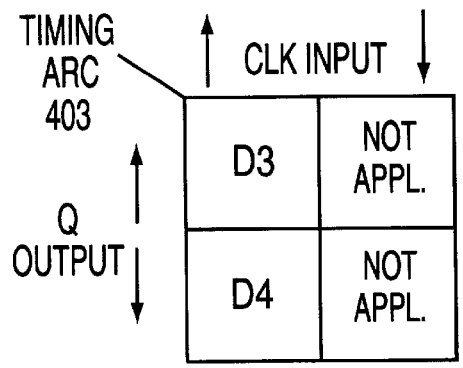

FIG. 4 depicts an example of how RF timing tables are initially created for a set of launch flip flops in a circuitry section whose timing is to be analyzed. FIG. 4A depicts, for example, two D-type flip flops 400 and 401 with Q output pins, respectively, of 404 and 405. Q output 404 has timing arc 402 while Q output 405 has timing arc 403. Timing arc 402 is defined by the timing arc table of FIG. 4B, while timing arc 403 is defined by the timing arc table of FIG. 4C. Q output 404 has a RF timing table 406 created for it, while Q output 405 has RF timing table 407 created for it. The values for RF timing tables 406 and 407 are determined, in accordance with the general description above, from their corresponding timing arc tables. RF timing table 406 is given tag 408, indicating its flip flop 400 is driven by "CLK 1," and RF timing table 407 is given tag 409, indicating its flip flop 401 is driven by "CLK 2."

Propagation of tagged RF timing tables, through the combinational units of a circuitry section, is accomplished as follows.

Figure 5:
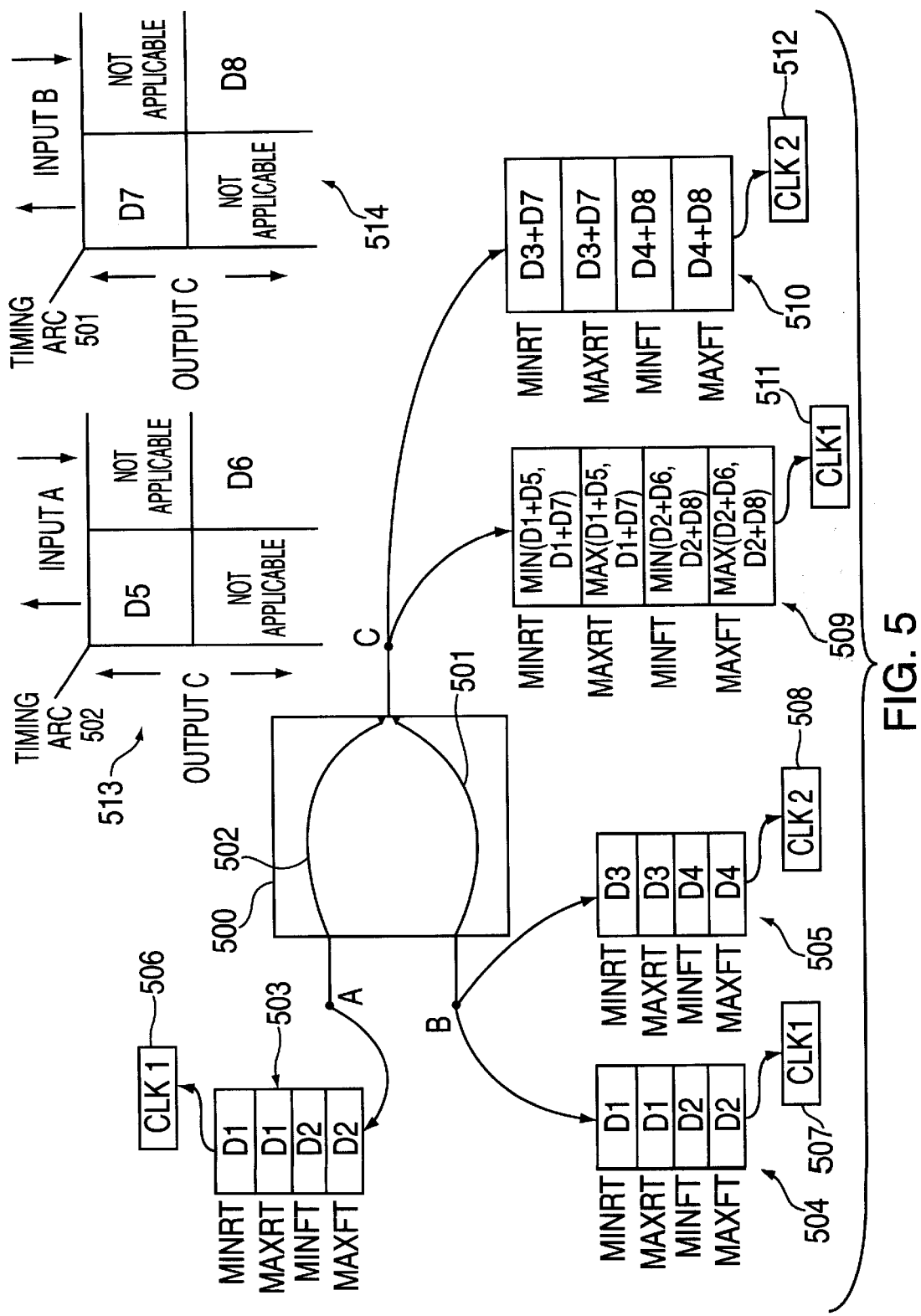
FIG. 5 renders the propagation of tagged RF timing tables, in accordance with the present invention, through a combinational gate.

A specific example is shown in FIG. 5. FIG. 5 depicts a non-inverting combinational gate 500 (such an an AND or OR) with two different timing arcs 501 and 502. Input pin "A" of gate 500 has an RF timing table 503 which is a copy of RF timing table 406 shown in FIG. 4A for CLK 1. Likewise, input pin "B" of gate 500 has an RF timing table 504 which is a copy of RF timing table 406 shown in FIG. 4A for CLK 1. Input pin "B" of gate 500 also has RF timing table 505 which is a copy of RF timing table 407 of FIG. 4A for CLK 2.

RF timing table 510 of FIG. 5 shows how RF timing table 505 is propagated through gate 500. Timing arc 501 adds a delay of D7 to rise times and a delay of D8 to the fall times. The tag 508 of RF timing table 505 identifies "CLK 2" and this identification is unchanged in tag 512 of RF timing table 510.

The propagation of RF timing tables 503 and 504 through gate 500 to produce RF timing table 509 is more complex since it is the result of comparing the delays at inputs "A" and "B." In particular, the computation of RF timing table 509 can be viewed as being comprised of two distinct steps: i) calculating two temporary RF timing tables for output "C"

and ii) combining the two temporary RF timing tables. The first temporary timing table is the result of applying timing arc 502 to RF timing table 503, while the second temporary timing table is the result of applying timing arc 501 to RF timing table 504. The first temporary RF timing table is comprised of the following values: minRT is D1+D5, maxRT is D1+D5, minFT is D2+D6 and maxFT is D2+D6. The second temporary RF timing table is comprised of the following values: minRT is D1+D7, maxRT is D1+D7, minFT is D2+D8 and maxFT is D2+D8. As can be seen in RF timing table 509 of FIG. 5, the combination of the first and second temporary RF timing tables is accomplished by taking the minimum or maximum of each pair of corresponding values, depending upon whether the final value in RF timing table is supposed to be, respectively, a minimum or a maximum value.

Figure 8:
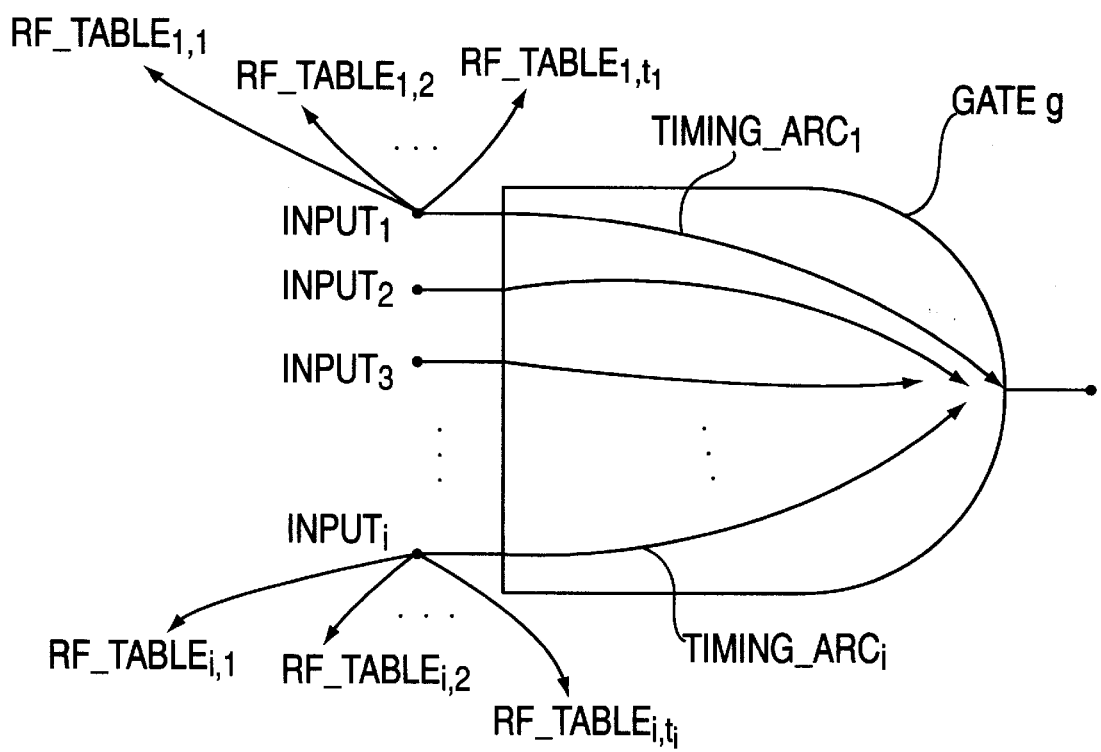
FIG. 8 renders schematically, in part, the general propagation of RF timing tables from a gate's inputs to its outputs.

In general, propagation of RF timing tables from a gate's inputs to its outputs is accomplished as follows. The following discussion of LOOP1 and LOOP2 is illustrated through FIG. 7 which is written in a pseudo code based on the C Programming Language. Assume we have a gate g with i inputs. This propagation procedure begins with a first loop, call it "LOOP1," which loops over each input to gate g. LOOP1 refers to each input to gate g as $input_k$, where k ranges from 1 to i. Within LOOP1 is a second "LOOP2" which loops over all the RF timing tables pointed to by $input_k$. LOOP2 refers to the number of RF timing tables for each $input_k$ as $t_k$ and loops with a value q which ranges from 1 to $t_k$. Each RF timing table pointed to by an $input_k$ is called $RF\_table_{k,q}$. For each $RF\_table_{k,q}$, a temporary RF_timing table $RF\_table_{k,q}'$ is created for gate g's output with the values of $RF\_table_{k,q}$ altered according to the timing arc $timing\_arc_k$, where $timing\_arc_k$ is from $input_k$ to gate g's output. Such a gate g is partially depicted in FIG. 8.

$RF\_table_{k,q}'$ is created from $timing\_arc_k$ and $RF\_table_{k,q}$ as follows. Firstly, $RF\_table_{k,q}'$ is given the same tag as $RF\_table_{k,q}$. Therefore, if the tag of table $RF\_table_{k,q}$ uniquely identifies a "L_CLOCK1," where L_CLOCK1 is an element of L_CLOCKS, then the tag of $RF\_table_{k,q}'$ uniquely identifies the same clock. As discussed above, an RF timing table comprises the following four values: minRT, maxRT, minFT, and maxFT. A timing arc, which was discussed above in terms of a timing arc table, will now be described as a function "$timing\_arc_k(a, b)$." The $timing\_arc_k(a,b)$ function's two inputs are defined as follows: i) input "a" takes the direction of an edge being applied to $input_k$ and ii) input "b" takes the direction of an edge which could be output from gate g. In response to these two inputs, $timing\_arc_k(a,b)$ outputs a value of the delay between the application of the specified input edge and the output of the specified output edge, assuming that the input edge does in fact produce the output edge. If the specified output edge cannot be produced for the specified input edge, then a symbol indicative of this inapplicability is output.

In calculating minRT and maxRT for $RF\_table_{k,q}'$, we are interested in the delays produced when the output of gate g is rising. Therefore, we want $timing\_arc_k(a,b)$ to take a rising edge as input "b." For input "a," both a rising edge and a falling edge is input. Assume that for an input to $timing\_arc_k(a,b)$ of a rising edge on "b" and a rising edge on "a," the output delay is D1. Assume that for an input to $timing\_arc_k(a,b)$ of a rising edge on "b" and a falling edge on "a," the output delay is D2. Then minRT of $RF\_table_{k,q}'$ is the minimum of the following two values: i) D1 summed with minRT of $RF\_table_{k,q}$ and ii) D2 summed with minFT of $RF\_table_{k,q}$. Similarly, maxRT of $RF\_table_{k,q}'$ is the maximum of the following two values: i) D1 summed with maxRT of $RF\_table_{k,q}$ and ii) D2 summed with maxFT of $RF\_table_{k,q}'$.

In calculating minFT and maxFT for $RF\_table_{k,q}'$, we are interested in the delays produced when the output of gate g is falling. Therefore, we want $timing\_arc_k(a,b)$ to take a falling edge as input "b." For input "a", both a rising edge and a falling edge is input. Assume that for an input to $timing\_arc_k(a,b)$ of a falling edge on "b" and a rising edge on "a", the output delay is D3. Assume that for an input to $timing\_arc_k(a,b)$ of a falling edge on "b" and a falling edge on "a," the output delay is D4. Then minFT of $RF\_table_{k,q}'$ is the minimum of the following two values: i) D3 summed with minRT of $RF\_table_{k,q}$ and ii) D4 summed with minFT of $RF\_table_{k,q}$. Similarly, maxFT of $RF\_table_{k,q}'$ is the maximum of the following two values: i) D3 summed with maxRT of $RF\_table_{k,q}$ and ii) D4 summed with maxFT of $RF\_table_{k,q}$.

When LOOP1 finishes, the total number of $RF\_table_{k,q}'$ tables, pointed to by g's output, will be:

$$total' = t_1 \times t_2 \times \ldots t_i \qquad (1)$$

Among these total' tables, assume there are tags representing a total of "c" different clocks. Assume that a copy of each of the "c" unique identifiers, utilized amongst the tags of the $RF\_table_{k,q}'$ tables, is in a set called "TAGS_G." Upon the completion of LOOP1, a LOOP3 is begun in which a variable "TAG_G" takes on, successively, each of the unique identifiers in TAGS_G. For each iteration of LOOP3, all the $RF\_table_{k,q}'$ tables pointed to by the output of gate g, which are tagged with a unique clock identifier equal to the current value of TAG_G, are identified and moved to a list which shall be referred to as "$RF\_tables_{TAG\_G}$." From $RF\_tables_{TAG\_G}$ a combined final RF timing table, which shall be referred to as "$RF\_table\_final_{TAG\_G}$," is determined. The output of gate g is then made to point to $RF\_table\_final_{TAG\_G}$. The combination of the tables listed on $RF\_tables_{TAG\_G}$ to produce $RF\_table\_final_{TAG\_G}$ is accomplished in the following manner. minRT of the $RF\_table\_final_{TAG\_G}$ is the minimum of all the minRTs amongst the RF timing tables listed in $RF\_tables_{TAG\_G}$. maxRT of $RF\_table\_final_{TAG\_G}$ is the maximum of all the maxRTs amongst the RF timing tables listed in $RF\_tables_{TAG\_G}$. minFT of $RF\_table\_final_{TAG\_G}$ is the minimum of all the minFTs amongst the RF timing tables listed in $RF\_tables_{TAG\_G}$. maxFT of $RF\_table\_final_{TAG\_G}$ is the maximum of all the maxFTs amongst the RF timing tables listed in $RF\_tables_{TAG\_G}$.

Following the completion of LOOP3, the final RF timing tables pointed to by g's output are ready to be propagated, in turn, to the inputs of any other gates, or capture flip flops, to which the output of g may be wired.

It should be noted that delays introduced by wire objects are taken into account when propagating an RF timing table from the output pin of one device object to the input pin of another device object. The wires effect an RF timing table by adding an additional fixed delay to each of the RF timing table's four fields of minRT, maxRT, minFT and maxFT.

Since the combinational network between the launch flip flops and the capture flip flops is acyclic, it is easy to assign a "level" number to each combinational gate. The propagation of the RF timing tables then proceeds in a levelized order, wherein all the gates at a particular level have all of their final RF timing tables propagated to their outputs before all the gates at the next-higher level, in turn, have all of their final RF timing tables propagated to their outputs.

Eventually, the first main phase of the static timing analysis of the present invention, propagation of tagged rise-fall (RF) timing tables, is completed when all the tables initially produced at the outputs of the launch flip flops L_FFS have been completely propagated to the inputs of all the capture flip flops C_FFS.

The second main phase of static timing analysis, relative constraint analysis, is performed as follows.

Each launch clock, which we shall refer to as "L_CLOCK_X", that is an element of the set of launch clocks L_CLOCKS, will have certain edges that are "launching edges" due to the ability of those edges to clock those launch flip flops of L_FFS, which we shall refer to as "L_FF_X," to which the launch clock is connected. Similarly, a capture clock, which we shall refer to as "C_CLOCK_Y", that is an element of the set of capture clocks C_CLOCKS, will have certain edges that are "capturing edges" due to the ability of those edges to clock those capture flip flops of C_FFS, which we shall refer to as "C_FFS_Y," to which the capture clock is connected.

For a launch clock L_CLOCK_X and a capture clock C_CLOCK_Y, a "computation period" is the period between a launching edge of L_CLOCK_X and a capturing edge of C_CLOCK_Y in which there are no intervening launching edges or capturing edges. The capturing edge of a computation period has setup and hold times associated with it. The setup time is the amount of time, prior to the capture edge, by which the data inputs to capture flip flops C_FFS_Y must be stable in order ensure correct latching by C_CLOCK_Y. The hold time is the amount of time, after the capture edge, through which the data inputs to capture flip flops C_FFS_Y must be stable in order to ensure correct latching by C_CLOCK_Y.

Depending upon the waveform for L_CLOCK_X the waveform for C_CLOCK_Y, and the relationship between these two waveforms, there may be several different computation periods.

The shortest computation period, between a launch clock L_CLOCK_X and a capture clock C_CLOCK_Y, determines the value of what we shall refer to as the "maximum allowable path delay" or "$MAPD_{x,y}$." For a launch clock L_CLOCK_X and a capture clock C_CLOCK_Y, the greatest overlap, between any of its computation periods and the hold time from any of its previous computation periods, sets a lower bound which we shall refer to as the "shortest allowable path delay" or "$SAPD_{x,y}$." That the greatest amount of overlap determines the lower bound of $SAPD_{x,y}$ can be seen from the following reasoning. Overlap between a later computation period and the hold time of an earlier computation period means that, should the later computation period's combinational logic computations complete before the hold time of the earlier computation period has finished, the capturing for the earlier computation period may be erroneously changed. The greater the overlap of the later computation with the hold time of the earlier computation period, the longer the combinational logic of the later computation period must take in order for it not to interfere with the latching of the results of the earlier computation period.

Assume that there are d launch clocks in L_CLOCKS and e capture clocks in C_CLOCKS. There will then be d×e values of $MAPD_{x,y}$ and $SAPD_{x,y}$. $MAPD_{x,y}$ and $SAPD_{x,y}$ are referred to as "relative constraints" since they are based upon the relative relationship of a launch clock and a capture clock. More specifically, $MAPD_{x,y}$ and $SAPD_{x,y}$ are the default timing constraints mentioned above as being alterable by exceptions.

Analysis of these relative constraints is accomplished as follows.

First, a flag called "TIMING_VIOLA?" is set to "false." A loop "LOOP4" loops over all the capture flip flops in C_FFS, where C_FF1 is successively set to point to each. For each capture flip flop C_FF1, the capture clock, which we shall refer to as C_CLOCK1, driving it is identified. In addition, for each capture flip flop C_FF1, a subloop "LOOP5" is started which loops over all the RF timing tables pointed to by the data input pin of C_FF1. Each of the RF timing tables looped over by LOOP5 shall be referred to as C_FF1_RF_TABLE. For each RF timing table C_FF1_RF_TABLE, the clock identifier in its tag uniquely identifies one of the launch clocks in L_CLOCKS. The launch clock identified by the tag shall henceforth be referred to as L_CLOCK1. Based upon L_CLOCK1 and C_CLOCK1, the appropriate values of MAPD and SAPD are identified and shall be referred to as $MAPD_{L\_CLOCK1,C\_CLOCK1}$ and $SAPD_{L\_CLOCK1,C\_CLOCK1}$. If both maxRT and maxFT of C_FF1_RF_TABLE are less than $MAPD_{L\_CLOCK1,C\_CLOCK1}$, then maxRT and maxFT satisfy the relative constraint of $MAPD_{L\_CLOCK1,C\_CLOCK1}$. If both minRT and minFT of C_FF1_RF_TABLE are greater than $SAPD_{L\_CLOCK1,C\_CLOCK1}$, then minRT and minFT satisfy the relative constraint of $SAPD_{L\_CLOCK1,C\_CLOCK1}$. If either $MAPD_{L\_CLOCK1,C\_CLOCK1}$ or $SAPD_{L\_CLOCK1,C\_CLOCK1}$ is not satisfied, then the flag TIMING_VIOLA? is set to "true." If LOOP4 finishes with TIMING_VIOLA? set to "false," then the circuit section has successfully passed static timing analysis.

The static timing analysis of the present invention has been explained, thus far, without an implementation of "exceptions."

An "exception statement" is defined to be a user-specified command which, for a particular path or set of paths through a circuit section, alters the default timing constraints of certain MAPD's and/or SAPD's. Therefore, an exception statement comprises two main components: i) a "path specification" which specifies the path or paths for which the exception statement applies, and ii) a "timing alteration" which alters the default timing constraints of the specified paths. With respect to the basic two-phase structure of static timing analysis presented above, the path specification of an exception statement effects the first phase of RF timing table propagation, while the timing alteration effects the second phase of relative constraint analysis.

Syntactically, for Design Compiler, an exception statement is defined as having the following structure:

<timing_alteration>[value]<path_specification><delimiter>

<timing_alteration> can be any one of "set_false_path", "set_multicycle_path", "max_delay" or "min_delay." [value] is a numeric value which is used in conjunction with set_multicycle_path, set_max_delay and set_min_delay, as discussed below. set_false_path, for paths satisfying the path specification, sets the relevant MAPD's to infinity and the relevant SAPD's to zero. set_multicycle_path alters MAPD as follows. As discussed above, MAPD is the length of the shortest computation period between a launch clock L_CLOCK_X and a capture clock C_CLOCK_Y We shall refer to an edge of L_CLOCK_X, which begins such a shortest computation period, as L_EDGE and we shall refer to an edge of C_CLOCK_Y, which ends such a shortest computation period, as C_EDGE1. Following any particular C_EDGE1, there will continue to be a series of edges of C_CLOCK_Y, which can act as a capture edge, that we shall refer to as the sequence: C_EDGE2, C_EDGE3, . . . . set_multicycle_path alters the relevant MAPD's, for paths satisfying the path specification, to be of the time period from L_EDGE to any one of C_EDGE1, C_EDGE2, C_EDGE3, . . . . The particular edge of C_CLOCK_Y is selected by [value], where value is an integer >1. max delay sets the relevant MAPD's, for paths that satisfy the path specification, to an arbitrary maximum time (leaving SAPD's unaffected), while min_delay sets the relevant SAPD's, for paths that satisfy the path specification, to an arbitrary minimum time (leaving MAPD's unaffected).

<path specification> is specified according to the syntax to be discussed below.

<delimiter> ends the exception statement. <delimiter> can be either a semicolon character or a newline character. A newline character can be suppressed as a delimiter, permitting multiline exceptions, by preceding it with a backslash character.

The <path_specification> is a logical expression which evaluates to "true" for certain paths through a circuit section and otherwise evaluates to "false."

At its highest level of structural organization, a <path_specification> is comprised of one or more "path specifiers." These path specifiers may be selected from amongst: "-from", "-to" or "-through." Following each of "-from", "-to" or "-through" the designer specifies an argument that is one of the following: a single HLHDL port, a single netlist-level pin, a list of HLHDL ports, a list of netlist-level pins, a netlist-level combinational device, a netlist-level flip flop or a list of netlist-level devices which may be any combination of combinational devices or flip flops. The names of netlist-level pins and devices may be obtained by the designer, as was discussed above, from the generic technology viewer which allows the designer to view generic technology circuit 102. A path specifier argument which is a list has the items of the list separated by at least once space with the whole list being enclosed by curly braces. A path specifier argument which is a list of items is understood to be the logical "OR" of its items. All path specifier arguments, regardless of the level expressed at by the designer, are translated into either the specification of a single netlist-level pin or a list of netlist-level pins. A path specifier argument which is a single netlist-level pin is interpreted as "satisfied" or "true" for any path through the netlist which includes that pin. A path specifier argument which is a list of netlist-level pins is interpreted as "satisfied" or "true" for any path through the netlist which includes at least one of those pins.

Each port of a path specifier argument is translated into a netlist-level pin as follows. At the generic technology level, the port is represented by a device known as a "boundary marker." A boundary marker is a single-input single-output non-inverting "device" with zero delay. The port at the HLHDL level is translated into specifying the output pin of its netlist-level boundary marker. Each netlist-level combinational device of a path specifier argument is translated into a specification of the netlist-level output pin of the combinational device. Each netlist-level flip flop of a path specifier argument is translated into a specification of the netlist-level output pin or pins of the flip flop device.

A <path_specification> can include only one "-from" and/or one "-to." If a <path_specification> includes both a "-from" and a "-to," they may appear in any order.

"-from" has the following meaning. A "-from" is satisfied by any paths that begin from a pin which is specified by the argument of the "-from." The pins specified in the argument of a "-from" must be the outputs or clock inputs of launch flip flops and/or input ports.

"-to" has the following meaning. A "-to" is satisfied by any paths that end at a pin which is specified by the argument of the "-to." The pins specified in the argument of a "-to" must be the non-clock inputs of capture flip flops and/or output ports.

"-through" has the following meaning. A "-through" is satisfied by any paths that pass through any pin which is specified by the argument of the "-through." The pins specified in the argument of a "-through" may not be the outputs of launch flip flops (which are to be specified only by a "-from") or the inputs of capture flip flops (which are to be specified only by a "-to"). A <path_specification> may contain an arbitrary number of "-through"s . A sequence of "-through"s may be interrupted by a "-from" and/or a "-to" at any point.

Multiple "-through"s may require satisfaction in either an order dependent or order independent manner. For "-through"s which require satisfaction in an order dependent manner, the "-through"s are only satisfied by paths which, as they traverse the circuit section from launch flip flops to capture flip flops, satisfy the "-through"s in the same order as the "-through"s are listed, left to right, in the <path_specification>. For "-through"s which require satisfaction in an order independent manner, the "-through"s are satisfied by paths which pass through, in any order, at least one of the pins specified by each of the "-through"s .

Thus far, the syntax and semantics of a single exception statement has been described.

Two or more exception statements, with the same timing alteration, act, from a semantic point of view, as if they were one exception statement, with the same timing alteration, but with the path specification being a logical OR of each path specification of the individual exception statements.

Some examples will now be presented to illustrate the above-described general rules for single exception statements and the combination of multiple exception statements which have the same timing alteration.

Consider the following exemplary exception (which has been labeled with a "(1)" that is not part of the exception input language):

set_false_path -from input1 -to output1; (1)

This exception alters the default timing constraints, according to the "set_false_path" timing alteration discussed above, for the path beginning at a pin "input1" and ending at a pin "output1." Pin "input1" must be the output to a launch flip flop, and pin "output1" must be the input to a capture flip flop. Consider now the following more complex exception example (2):

set_false_path -from {input1 input2} -to {output1 output2}; (2)

This exception alters the default timing constraints, according to the "set_false_path" timing alteration discussed above, for any path beginning at either pin "input1" or "input2" and ending at either pin "output1" or "output2." Pins "input1" and "input2" must be the output to a launch flip flop, and pins "output1" and "output2" must be the input to a capture flip flop. Exception example (2) could alternatively be expressed as the following four exceptions, in the following example (3):

set_false_path -from input1 -to output1; (3)

set_false_path -from input1 -to output2;

set_false_path -from input2 -to output1;

set_false_path -from input2 -to output2;

Example (3) is equivalent to example (2) since the four exceptions of example (3) are treated, from a semantic point of view, as one exception with "set_false_path" as its timing alteration and with the four path specifiers logically ORed together. In effect, example (3) is treated as following example (4) (however the syntax of example (4) is not actually allowed in the current Design Compiler 103):

set_false_path (-from input1 -to output1) OR\

(-from input1 -to output2) OR\

(-from input2 -to output1) OR\

(-from input2 -to output2); (4)

Example (5) below is intended to illustrate the "-through" path specifier, in conjunction with "-from" and "-to":

set_false_path -from input1 -through {pin1 pin2}\-through {pin3 pin4} -to output1; (5)

Example (5) is equivalent to the following example (6):

set_false_path -from input1 -through pin1 -through pin3 \-to output1;

set_false_path -from input1 -through pin1 -through pin4 \-to output1;

set_false_path -from input1 -through pin2 -through pin3 \-to output1;

set_false_path -from input1 -through pin2 -through pin4 \-to output1; (6)

Note that the meaning of examples (5) and (6) will be different depending upon whether the "-through"s are interpreted as order dependent. If the "-through"s are treated as order dependent, then these two examples can only be satisfied by paths which (in addition to beginning at input1 and ending at output1) pass through pin1 or pin2 first, before passing through pin3 or pin4. If the "-through" is treated as order independent, then these two examples are satisfied by paths which (in addition to beginning at input1 and ending at output1) pass through: i) pin1 or pin2 and then pin3 or pin4, or ii) pin3 or pin4 and then pin1 or pin2.

A first way of implementing the exception statement language described above is accomplished through the following steps of: first-way preprocessing, first-way pin-labeling, first-way modified RF timing table propagation and first-way modified relative constraint analysis.

We shall refer to the initial set of exception statements, prepared by the designer, as the "input exception statements." The first-way preprocessing is performed on the input exception statements to produce a set of "preprocessed exception statements." Initially, the input exception statements are converted into "pin-wise exception statements" in which all of the path specifier arguments have been converted, according to the rules discussed above, to be specified in terms of netlist-level pins. Note that in certain cases, a single item argument in an input exception statement may be translated into a list of pins. For example, if the designer has specified a particular launch flip flop as the single argument of a "-from," that single flip flop argument is translated into a two-item list specifying the "Q" and "-Q" output pins of the flip flop.

Certain of the pin-wise exception statements we shall refer to as "compound pin-wise exception statements." A compound pin-wise exception statement has at least one of its path specifiers, the path specifiers being selected from types "-from," "-to" or "-through," having an OR-type list of pins as its argument. Pin-wise exception statements which are not compound pin-wise exception statements are copied directly to the set of preprocessed exception statements.

Each compound pin-wise exception statement is converted into multiple pin-wise exception statements which implement the same semantics but have only single pins specified as the argument to all path specifiers. In effect, this is computing a kind of "cross product" of all the OR-type arguments in a compound pin-wise exception statement. The "cross product" of each compound pin-wise exception statement is added to the set of preprocessed exception statements.

"First-way pin-labeling" is accomplished as follows. A loop "LOOP6" loops over every argument of every path specifier in the set of preprocessed exception statements. For each iteration of LOOP6, a variable "PS_ARG" takes as its value a "label" which represents a copy of the current path specifier argument being looped over. The pin in the netlist circuit section, corresponding to PS_ARG, is located and shall be referred to as "PS_ARG_PIN." PS_ARG_PIN is then checked to see whether it is already pointing to its own copy of an "exception flag" data structure which indicates that this pin is the subject of at least one preprocessed exception statement. If PS_ARG_PIN is not already pointing to an exception flag, then an exception flag is created for it.

First-way modified RF timing table propagation proceeds as follows. First-way modified RF timing table propagation is the same as the "regular" (or non-exception supporting) RF timing table propagation described above, with the following three modifications. First, the tags pointed to by RF timing tables are structured into two main parts: a first part which contains the unique identifier of a launch clock as described above, and a second part which can contain labels for path specifier arguments. Secondly, each time an RF timing table, which we shall generically refer to as RFTT_X, of a certain kind is created, a check is made to determine whether the pin to which it is attached, which we shall refer to as PIN_X, has an exception flag. The kinds of RF timing tables for which this check is made are: i) RF timing tables created initially for the output pins of the launch flip flops, ii) RF timing tables created when an RF timing table is propagated across a wire to the input of a combinational unit or to the input of a capture flip flop, and iii) the final RF timing table, referred to above as RF_table_final$_{TAG\_G}$, created from RF_tables$_{TAG\_G}$ for the output of a gate g. If such an exception flag exists, then the following determination is made. A label, which represents how PIN_X is referred to in a preprocessed exception statement, is considered for addition to RFTT_Xs tag. If the label being considered, by itself or in conjunction with any selection of labels already on the tag, satisfies, or can possibly satisfy, a path specification of at least one of the preprocessed exception statements, then the label is added to the tag.

The third modification of first-way modified RF timing table propagation, with respect to RF timing table propagation as described above, is with respect to LOOP3. LOOP3 is replaced with the following LOOP7. LOOP7 successively identifies each unique type of tag, among the tables RF_table$_{k,q}$', and refers to a copy of that unique tag type by the variable TAG_G. For two tags to be of the same "type": i) their first parts must both uniquely identify the same launch clock, and ii) their second parts must both contain the same set of pin labels. All RF_table$_{k,q}$' tables, with tags of the same type, as identified by the current value of TAG_G, are identified and moved to a list referred to as "RF_tables$_{TAG\_G}$." In the same manner as discussed above with respect to LOOP3, the RF timing tables of RF_tables$_{TAG\_G}$ are replaced by a combined final RF timing table, which is referred to as "RF_table_final$_{TAG\_G}$," which is pointed to by the output pin of gate g.

If the path specifier "-through" is implemented to work in an ordered fashion, then it is helpful if the label-containing part of the tag holds the labels as an ordered list which orders the labels according to the order in which they were encountered as the RF timing table propagated through the circuit section. In implementing an ordered "-through," if a "-through" label is encountered, which would satisfy a "-through" that is to the right of a "-through" not satisfied by a label already in the tag, then the "-through" is not added to the tag.

If the path specifier "-through" is implemented to work in an unordered fashion, then there are two possible implementations depending upon whether "reachability" information is kept. "Reachability" information would specify, upon the basis of the "-through" label being considered for addition to the tag and the "-through"s satisfied by labels already in the tag, whether there is any preprocessed exception statement which can possibly be satisfied upon further RF timing table propagation. The problem with using reachability within Design Compiler 103 is that it would often have to be updated as the network described by the netlist changes due to various mappings and/or optimizations. If reachability information is not kept, then each time a "-through" is satisfied by a label, the label must be added to the tag.

The third modification, of first-way modified RF timing table propagation, is particularly significant since it means that even if two RF timing tables specify the same launch clock in the first part of their tags, they will be maintained as separate tables so long as even one of labels in the second part of their tags is different. In addition, LOOP7 will tend to take longer to execute then LOOP3 since there will tend to be more types of tags, amongst the inputs to a gate, then there are different launch clocks represented amongst the inputs to the same gate. It would therefore be desirable to minimize the number of types of tags, by minimizing the types of labels used to mark pins satisfying exceptions, and this is the goal of the second way of implementing the exception statement input language.

First-way modified relative constraint analysis proceeds as follows. First-way modified relative constraint analysis is the same as the relative constraint analysis described above, except for the following two changes.

First, for each RF timing table C_FF1_RF_TABLE looped over by LOOP5, as discussed above, a determination is made as to the subset of preprocessed exception statements, which we shall refer to as "C_FF1_EXCEPS," that are satisfied by the labels in the second part of C_FF1_RF TABLE's tag. Typically, only one preprocessed exception statement will be satisfied but, in case C_FF1_EXCEPS contains more than one preprocessed exception statement, precedence rules among timing alterations are used. The three default precedence levels among the timing alterations, in order of descending precedence, are as follows: i) "set_false_path," ii) "max_delay" and "min_delay have the same precedence level because they can never conflict with each other, and iii) "set_multicycle_path." This default precedence could be altered with a user-specified "-precedence" option, added to the exception statement input language utilized by the designer. In one implementation, the "-precedence" option, which would be followed by a user-selectable "precedence-level number," would be included with those exception statements whose default precedence is to be changed. A higher precedence-level number would indicate a higher precedence. For example, a "set_multicycle_path" exception statement might be given a precedence-level number of 10, while a "set_false_path" exception statement might be given a precedence-level number of 5, in order to alter the default precedence and give that particular "set_multicycle_path" exception statement precedence over that particular "set_false_path" exception statement. In case two or more preprocessed exception statements are in C_FF1_EXCEPS, with different numerical parameters for the same timing alteration, then the path specifications of these preprocessed exception statements are analyzed for certain disambiguating characteristics. The single timing alteration which is chosen to be applied for C_FF1_RF_TABLE shall be referred to as "C_FF1_RF_TABLE_TA."

The second change for first-way modified relative constraint analysis, from relative constraint analysis as described above, is that each pair of $MAPD_{L\_CLOCK1,C\_CLOCK1}$, and/or $SAPD_{L\_CLOCK1,C\_CLOCK1}$ selected by LOOP5 is modified according to C_FF1_RF_TABLE_TA to produce $MAPD_{L\_CLOCK1,C\_CLOCK1}'$ and/or $SAPD_{L\_CLOCK1,C\_CLOCK1}'$. If $MAPD_{L\_CLOCK1,C\_CLOCK1}'$ is calculated, then it is compared with maxRT and maxFT, otherwise $MAPD_{L\_CLOCK1,C\_CLOCK1}$ is compared with maxRT and maxFT. If $SAPD_{L\_CLOCK1,C\_CLOCK1}'$ is calculated, then it is compared with minRT and minFT, otherwise $SAPD_{L\_CLOCK1,C\_CLOCK1}$ is compared with minRT and minFT. If the appropriate MAPD is not satisfied or the appropriate SAPD is not satisfied, then the flag TIMING_VIOLA? is set to "true."

A second way of implementing the exception statement input language described above is accomplished through the following steps of: second-way preprocessing, second-way pin-labeling, second-way modified RF timing table propagation and second-way modified relative constraint analysis.

As was done above, we shall refer to the initial set of exception statements, prepared by the designer, as the input exception statements. The second-way preprocessing is performed on the input exception statements, in two main phases, to produce the set of preprocessed exception statements.

The first phase of second-way preprocessing is the same as the first-way preprocessing described above, except that the exception statements output by first-way preprocessing are called an "intermediate preprocessed exception statements" rather than preprocessed exception statements.

In the second phase of second-way preprocessing, the intermediate preprocessed exception statements are converted into the set of preprocessed exception statements.

Essentially, the second phase of second-way preprocessing may be viewed as achieving the following. The intermediate preprocessed exception statements may be viewed as a canonical sum-of-products form for expressing those groups of input exception statements which share a common timing alteration. In the second phase of second-way preprocessing, each such sum-of-products among the intermediate exception statements is converted into one or more product-of-sums. Each such product-of-sums is then converted into a separate exception statement where each of the "sums" in the product-of-sums becomes an OR-type list argument to the appropriate type of path specifier.

The second phase of second-way preprocessing, for order dependent "-through"s, accomplishes its identification of product-of-sums expressions as described in the pseudocode of FIGS. 9A–B (which is based on the C Programming Language). FIGS. 9C–G simulate, step-by-step, the execution of both the first and second phases of second-way preprocessing. The second phase of second-way preprocessing, for order independent "-through"s, accomplishes its identification of product-of-sums expressions as described in the pseudocode of FIG. 10 (which is also based on the C Programming Language).

Second-way pin-labeling is accomplished as follows. A loop "LOOP8" loops over every argument of every path specifier in the set of preprocessed exception statements. For each iteration of LOOP8, a variable "PS_ARG" takes as its value a "label" which represents the current path specifier argument being looped over. In the case where the label assigned to PS_ARG represents a single pin in the circuit section, this pin is located and shall be referred to as "PS_ARG_PIN." PS_ARG_PIN is then made to point to its own data structure, called an "argument container," unless PS_ARG_PIN already points to its own argument container. The particular argument container for PS_ARG_PIN shall be referred to as "PS_ARG_CONT." An argument container holds labels which represent arguments to path specifiers. PS_ARG_CONT is set to contain a copy of the current label held by PS_ARG. In the case where the label assigned to PS_ARG represents an OR of several pins in the circuit section, each of these sub-labels describing an individual pin is looped over, in turn, by a "LOOP9." Each sub-label looped over by LOOP9 shall be referred to by "PS_ARG_SL." The pin referred to by PS_ARG_SL is located in the circuit section and shall be referred to as PS_ARG_PIN. PS_ARG_PIN is then made to point to its own argument container data structure as defined above, unless PS_ARG_PIN already points to its own (nonempty) argument container. The particular argument container for PS_ARG_PIN shall be referred to as "PS_ARG_CONT" PS_ARG_CONT is set to contain a copy of the current label held by PS_ARG. The net result, in the case where the label assigned to PS_ARG represents an OR of several pins in the circuit section, is that each of the pins of the ORed path specifier argument has the same label put in its argument container.

Second-way modified RF timing table propagation proceeds as follows. Second-way modified propagation of RF timing tables is the same as the non-exception handling RF timing table propagation described above, except for the following three modifications. First, the tags pointed to by RF timing tables are structured into the same two main parts as with first-way modified RF timing table propagation. The only difference, from the first change as described above for first-way modified RF timing table propagation, is that the second part can contain labels, for path specifier arguments, which represent an OR of several individual pins, in addition to being able to contain labels that represent only an individual pin. Secondly, each time an RF timing table is created (which is one of the same three kinds as described above with respect to the second modification of regular RF timing table propagation to produce first-way modified RF timing table propagation), a check is made to determine whether the pin to which it is attached has an argument container (this differs from first-way modified RF table propagation where the pin is checked for an exception flag). If such an argument container exists, then a determination is made for each label it contains as to whether it should be added to the tag of the newly-created RF timing table. In deciding whether each label should be added to the tag of the newly-created RF timing table, the difference from first-way modified RF timing table propagation is that the label being considered for addition to the newly-created RF timing table's tag, as well as labels already in the newly-created RF timing table's tag, may satisfy an OR-type path specifier argument by representing the entire OR expression. For first-way modified RF timing table propagation, only labels representing an individual pin existed and these labels were considered for possible satisfaction of path specifier arguments consisting of only a single-pin specification.

The third modification, of second-way modified RF timing table propagation, is also the same as the third modification describe above for first-way modified RF timing table propagation, except that when tags are compared by LOOP7, to determine whether they are of the same type and therefore belong in the same RF_tables$_{TAG\_G}$, some of the tags may contain labels that represent OR-type arguments to path specifiers rather than just labels which represent an individual pin.

The fact that labels, in tags, may represent an entire OR-type argument to a path specifier is a very significant aspect of second-way RF timing table propagation. It means that all of the exception pins, which are named in an OR-type path specifier argument, identify themselves in tags as belonging to this OR-type path specifier argument with the same label. Having fewer labels means, in general, fewer types of tags, for the purposes of RF timing table propagation, and therefore fewer RF timing tables. This can result in very significant memory savings. In addition, having fewer RF timing tables means that the propagation of those tables, and therefore the speed with which a static timing analysis can be completed, will happen more quickly.

The above described considerations, with respect to the implementation of "-through" on an order or unordered basis in the situation of first-way modified RF timing table propagation, apply equally well with regard to second-way modified RF timing table propagation.

Second-way modified relative constraint analysis proceeds in the same manner as first-way modified relative constraint analysis, except that the first change, of first-way modified relative constraint analysis with respect to relative constraint analysis, is changed as follows. When a determination is made, as to the subset of preprocessed exceptions satisfied by the labels in C_FF1_RF_TABLE's tag, some of those labels may represent an entire OR-type argument to a path specifier.

Example Circuit Sections

Figure 11:
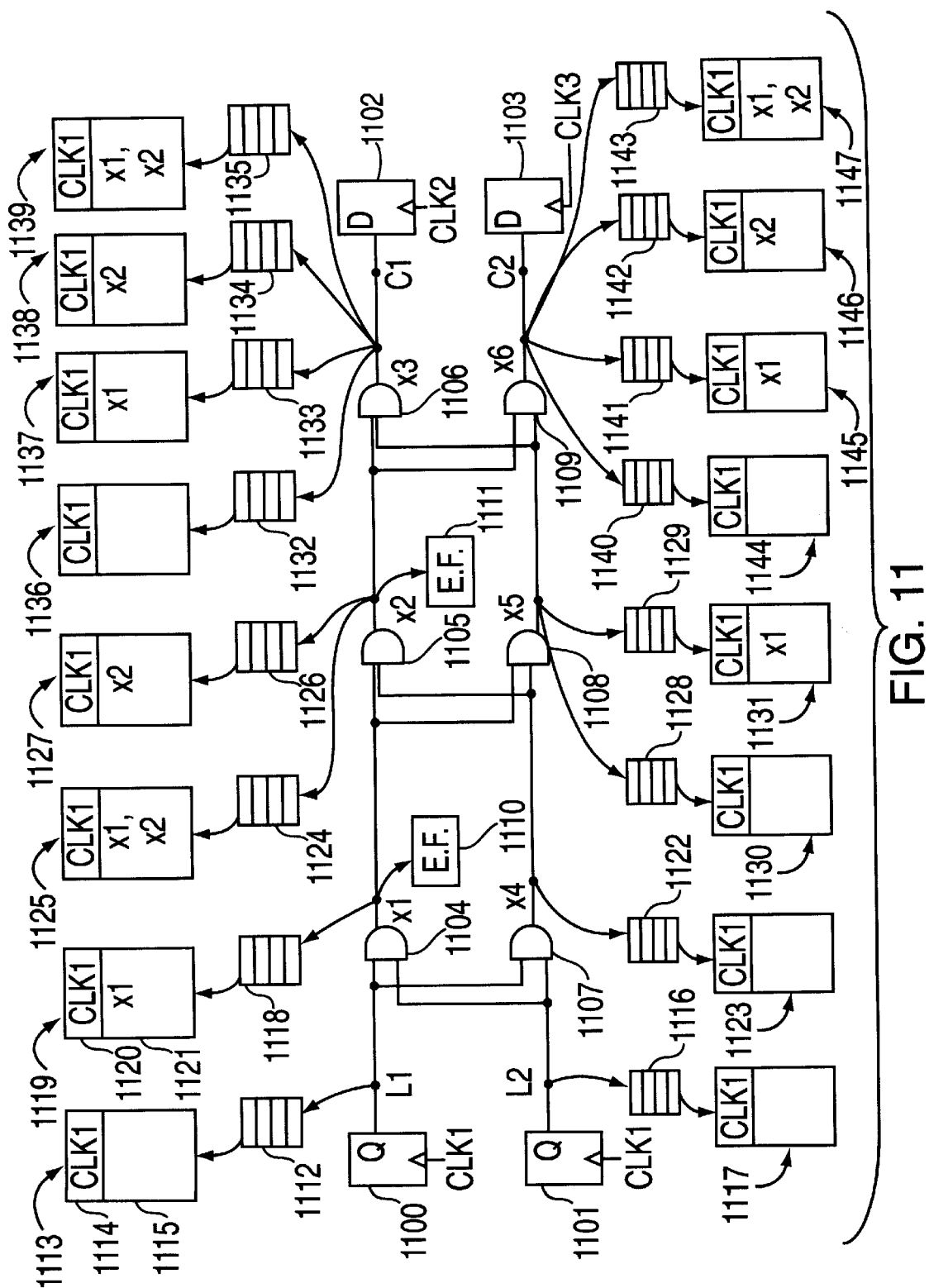
FIG. 11 shows an example circuit section which has been processed in accordance with a first way of implementing the exception statement input language.

FIG. 11 shows an example circuit section comprising: i) two launch flip flops 1100 and 1101 with output pins, respectively, of "L1" and "L2," ii) two capture flip flops 1102 and 1103 with input pins, respectively, of "C1" and "C2," and iii) six two-input AND gates 1104–1109 with output pins, respectively, of "X1" to "X6."

Both launch flip flops are driven by the same clock "CLK1," while each of the capture flip flops is driven by a different clock of "CLK2" and "CLK3."

Consider the following exception statement, example (7), has been written for this circuit section:

set_false_path -through {X1 X2}; (7)

This exception statement indicates that all paths through pin "X1" or pin "X2" should be subject to the "set_false_path" timing constraint.

FIG. 11 depicts the RF timing tables created, and their tags, when the first-way of implementing the exception statement language is utilized.

First-way preprocessing is performed first, and is described as follows. Input exception statement example (7) is already a pin-wise exception statement. Since input exception statement example (7) is a compound pin-wise exception statement, it must be converted into the following, example (8), multiple pin-wise exception statements:

set_false_path -through X1;

set_false_path -through X2; (8)

First-way pin labeling is accomplished as follows. LOOP6 first sets PS_ARG to "X1." Pin "X1" is therefore located in the network for the circuit section and is made to point to its own exception flag 1110 labeled as "E.F." in FIG. 11. In its next iteration LOOP6 causes pin "X2" to be located in the network and it is made to point to an exception flag 1111 labeled "E.F." in FIG. 11.

First-way modified RF timing table propagation then proceeds as follows. In accordance with regular RF timing table propagation, an RF timing table 1112 is created for output pin "L1" of flip flop 1100, and an RF timing table 1116 is created for output pin "L2" of flip flop 1101. The particular values of RF timing tables 1112 and 1116 are not shown, other than the fact that each has four entries, since the purpose of this diagram is to illustrate: i) the use of labels in RF timing table tags, and ii) the number of RF timing tables required for the number of exception paths specified.

RF timing table 1112 is given a tag 1113 which, in accordance with the first modification of regular RF timing table propagation to produce first-way modified RF timing table propagation, comprises a first part 1114 containing an unique identifier of "CLK1" and a second part 1115 which can contain labels for path specifier arguments. Second part 1115 is empty. RF timing table 1116 is similarly given a tag 1117.

As of this point in the propagation process, it is significant to note that tags 1113 and 1117 are of the same type since their first and second parts have the same contents.

It is significant to note that, in the interests of visual clarity, not all RF timing tables which would be produced are shown. For example, the creation of RF timing table 1118 will now be discussed as if it would be computed directly from timing tables 1112 and 1116. In fact, there would be an additional RF timing table on each input pin of AND 1104. These RF timing tables would take into account the delays introduced by the wires (as was discussed in general above) from the outputs of the launch flip flops to the inputs of AND 1104.

Also unshown is that fact that the propagation of RF timing tables 1112 and 1116 to produce a final RF timing table 1118 for the output of AND 1104, in accordance with LOOP1 as described above, creates two temporary RF timing tables 1112' and 1116' for output pin "X1." In accordance with the second modification of regular RF timing table propagation to produce first-way modified RF timing table propagation, when temporary RF timing tables 1112' and 1116' are created a check is made for an exception flag on pin "X1" to which they are attached. Since exception flag 1110 is found, a label "X1," which represents how pin "X1" is referred to in a preprocessed exception statement, is added to the second part of the tags for temporary RF timing tables 1112' and 1116'.

In accordance with the third modification of regular RF timing table propagation to produce first-way modified RF timing table propagation, LOOP7 combines temporary RF timing tables 1112' and 1116' to produce RF timing table 1118. RF timing table 1118 is shown, along with its tag 1119. Tag 1119 is of the same type as the unshown tags for temporary RF timing tables 1112' and 1116' since its first part identifies "CLK1" and its second part has the label "X1."

In a like manner, RF timing tables 1112 and 1116 are propagated to create final RF timing table 1122 for output pin "X4." Since pin "X4" does not have an exception flag, the tag created for final RF timing table 1122 has an empty second part.

Similarly, RF timing tables 1118 and 1122 are propagated to produce RF timing tables 1124 and 1126 at pin "X2."

When RF timing table 1122 is propagated through AND 1105 to produce a temporary RF timing table 1122' (not shown) at pin "X2," RF timing table 1122' gets a tag comprising tag 1123 augmented with the label "X2" due to exception flag 1111. Likewise, when RF timing table 1118 is propagated through AND 1105 to produce a temporary RF timing table 1118' (not shown) at pin "X2," RF timing table 1118' gets a tag comprising tag 1119 augmented with the label "X2" due to exception flag 1111. Since the tag of RF timing table 1122' is of a different type than the tag of RF timing table 1118', LOOP7 converts: i) RF timing table 1118' into RF timing table 1124 and ii) RF timing table 1122' into RF timing table 1126. In a similar manner, RF timing tables 1118 and 1122 are propagated to create RF timing tables 1128 and 1129 at pin "X5." RF timing table 1128 has the same tag as RF timing table 1122, and RF timing table 1129 has the same tag as RF timing table 1118, since pin "X5" is not marked with an exception flag.

Pin "X3" of AND 1106 points to four RF timing tables, 1132–1135, since there are four types of tags on the RF timing tables at the inputs to AND 1106. Specifically, RF timing table 1128 becomes RF timing table 1132, RF timing table 1129 becomes RF timing table 1133, RF timing table 1126 becomes RF timing table 1134, and RF timing table 1124 becomes RF timing table 1135. Similarly, pin "X6" of AND 1109 points to four RF timing tables 1140–1143, since there are four types of tags on the RF timing tables at the inputs to AND 1109.

Figure 12:
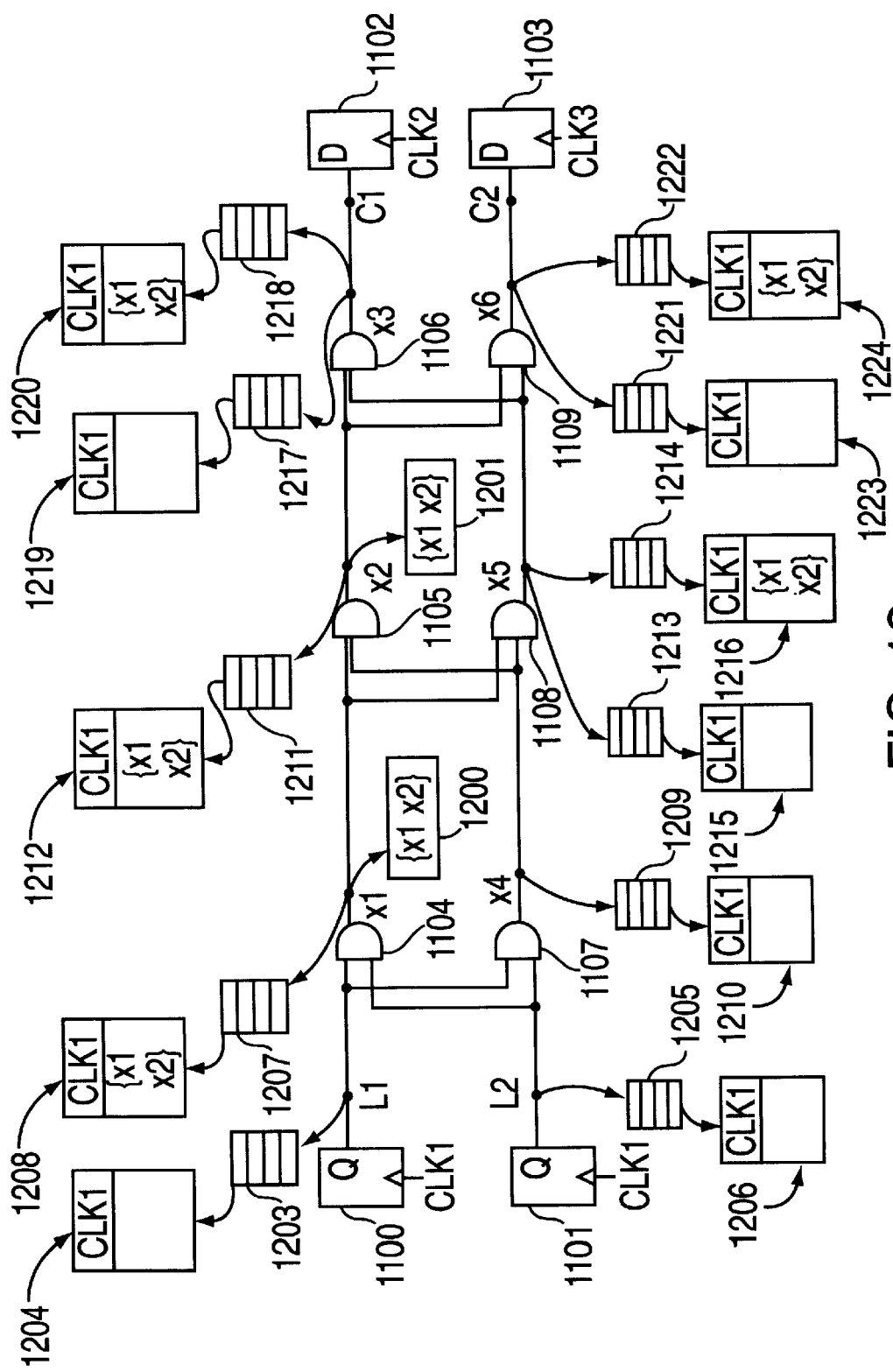
FIG. 12 shows an example circuit section which has been processed in accordance with a second way of implementing the exception statement input language.

FIG. 12 shows the same example circuit section of FIG. 11 comprising: i) two launch flip flops 1100 and 1101 with output pins, respectively, of "L1" and "L2," ii) two capture flip flops 1102 and 1103 with input pins, respectively, of "C1" and "C2," and iii) six two-input AND gates 1104–1109 with output pins, respectively, of "X1" to "X6."

FIG. 12 depicts the RF timing tables created, and their tags, when the second-way of implementing the exception statement language is utilized is used to apply exception statement example (7) to the circuit network of FIG. 12.

Second-way preprocessing is performed first, and is described as follows. The first phase of second-way preprocessing is the same as the first-way preprocessing described above, except that preprocessed exception statements of example (8) above are called intermediate preprocessed exception statements. In the second phase of second-way preprocessing, the intermediate preprocessed exception statements are converted into the set of preprocessed exception statements. The single terms of each intermediate preprocessed exception statement are combined to form the following example (9) preprocessed exception statement, with an OR-type "-through" argument, by either the order dependent algorithm of FIG. 9 or the order independent algorithm of FIG. 10:

$$\text{set\_false\_path -through }\{X1\ X2\};\quad\quad\quad(9)$$

Second-way pin labeling is accomplished as follows. A LOOP8 sets PS_ARG to the "-through" argument "{X1 X2}." Each of the sub-labels of PS_ARG is looped over by LOOP9. LOOP9 first causes PS_ARG_SL to be set to "X1" and pin "X1" is then located in the circuit network. Pin "X1" is then made to point to its own argument container 1200. Argument container 1200 is then set to contain the current label of "{X1 X2}" held by PS_ARG. On its next iteration, LOOP9 first causes PS_ARG_SL to be set to "X2" and pin "X2" is then located in the circuit network. Pin "X2" is then made to point to its own argument container 1201. Argument container 1201 is then set to contain the current label of "{X1 X2}" held by PS_ARG. The net result is that each of the pins of the OR-type path specifier argument "{X1 X2}" has the same label "{X1 X2}" put in its argument container.

Second-way modified RF timing table propagation then proceeds as follows. In accordance with regular RF timing table propagation, an RF timing table 1203 is created for output pin "L1" of flip flop 1100, and an RF timing table 1205 is created for output pin "L2" of flip flop 1101.

RF timing table 1203 is then propagated through AND 1104 to produce a temporary RF timing table 1203' (not shown) pointed to by pin "X1." In accordance with the second change, described above, of second-way modified RF timing table propagation from regular RF timing table propagation, when RF timing table 1203' is created a check is made which determines that pin "X1" has an argument container 1200. The label "{X1 X2}" in the argument container 1200 is then added to the second part of the tag of temporary RF timing table 1203' since it satisfies the path specifier argument "{X1 X2}." Similarly, RF timing table 1205 is propagated through AND 1104 to produce a temporary RF timing table 1205' (not shown) pointed to by pin "X1." In accordance with the third modification, described above, of second-way modified RF timing table propagation from regular RF timing table propagation, LOOP7 combines temporary RF timing tables 1203' and 1205' to produce final RF timing table 1207. RF timing table 1207 is shown along with its tag 1208. Tag 1208 is of the same type as the unshown tags for temporary RF timing tables 1203' and 1205'.

In a like manner, RF timing tables 1203 and 1205 are propagated to create final RF timing table 1209 for output pin "X4." Since pin "X4" does not have an exception flag, the tag 1210 created for final RF timing table 1209 has an empty second part.

RF timing tables 1207 and 1209 are propagated through AND 1105 to produce RF timing table 1211 at pin "X2." It is significant to note that pin "X2" only points to one RF timing table, while pin "X2" of FIG. 11 points to two RF timing tables. This is an example of how the higher-level pin labeling reduces the number of RF timing tables needed to perform a static timing analysis. When RF timing table 1207 propagates through AND 1105 to create temporary RF timing table 1207', the tag of RF timing table 1207' is unchanged from that of RF timing table 1207 (the label "{X1 X2}" is already in the tag so there is no need to add the same label "{X1 X2}" begin held in argument container 1201). When RF timing table 1209 propagates through AND 1105 to create temporary RF timing table 1209', the tag of RF timing table 1209' becomes the same as the tag of RF timing table 1207' (the label "{X1 X2}" is not already in the tag so it is added from argument container 1201).

RF timing table 1213 at pin "X5" is created from RF timing table 1209, and RF timing table 1214 at pin "X5" is created from RF timing table 1207.

Pin "X3" points to only two RF timing tables 1217 and 1218 since, amongst the three RF timing tables 1211, 1213 and 1214 at the inputs to AND 1106, there are only two types of tags. This is a dramatic reduction from FIG. 11, where pin "X3" points to four RF timing tables. Likewise, pin "X6" of FIG. 12 points to only two RF timing tables 1221 and 1222, in comparison with the four pointed to by pin "X6" of FIG. 11.

Figure 13:
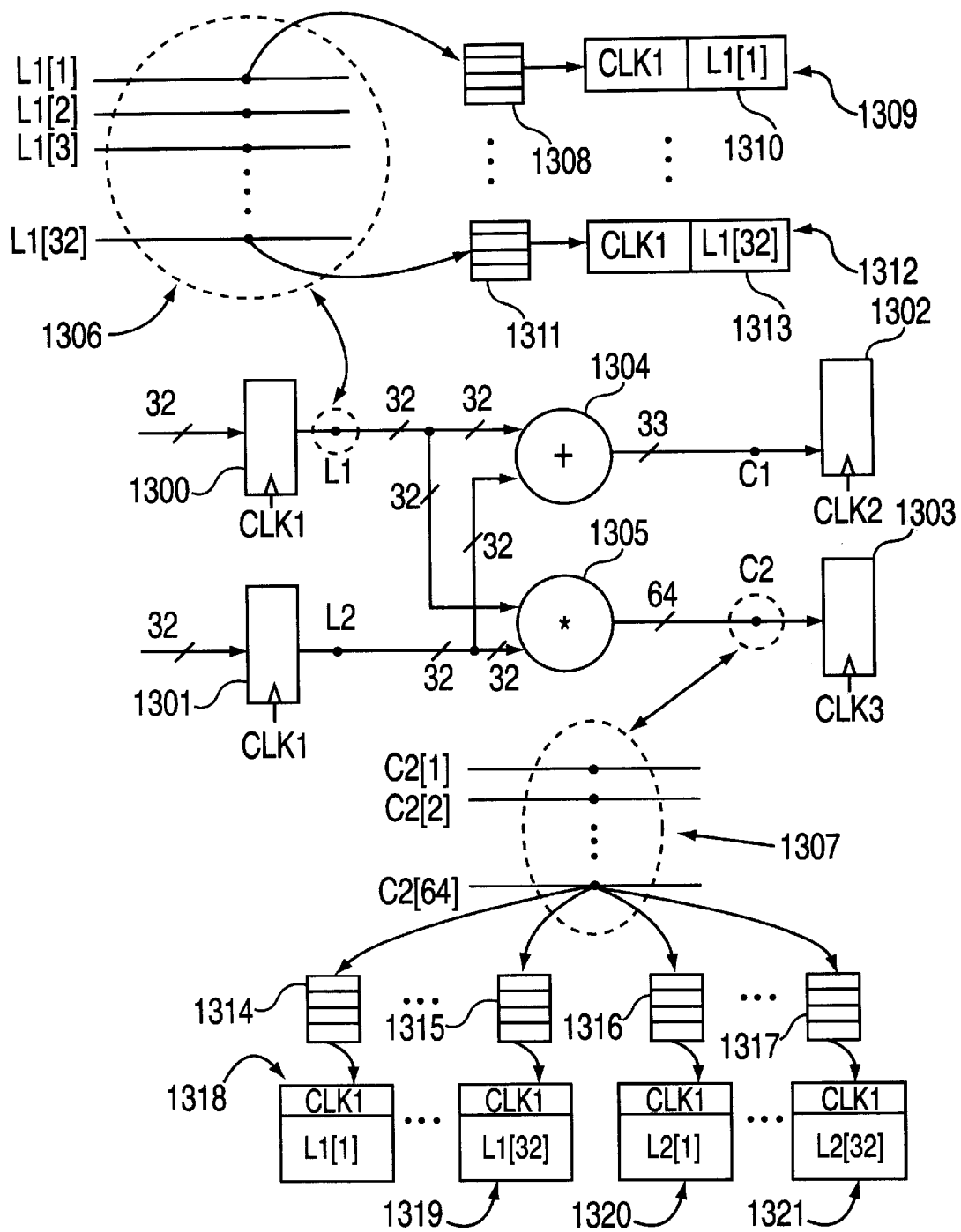
FIG. 13 shows an example circuit section which has been processed in accordance with a first way of implementing the exception statement input language.
Figure 14:
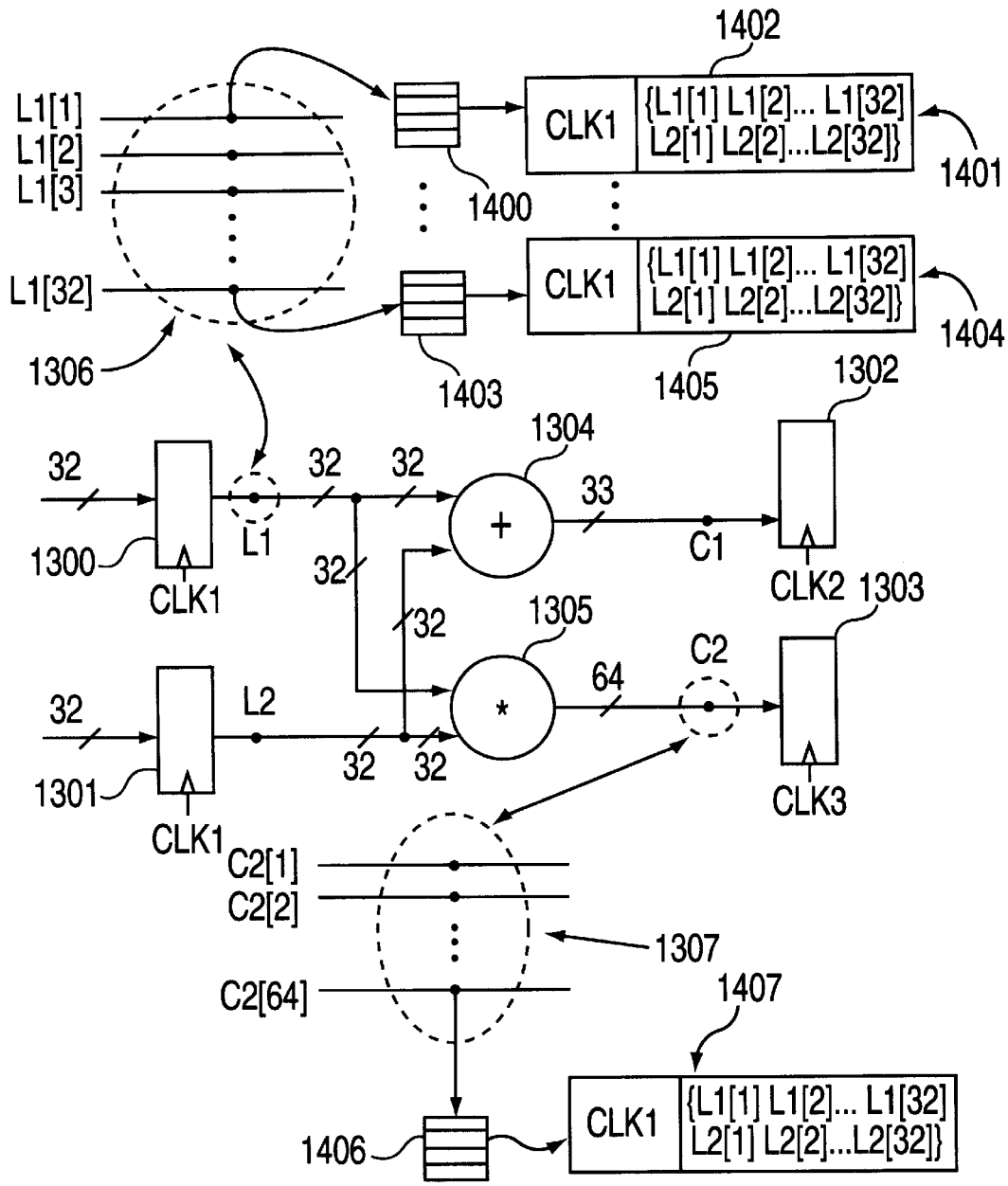
FIG. 14 shows an example circuit section which has been processed in accordance with a second way of implementing the exception statement input language.

The savings in the number of RF timing tables, afforded by the second-way of implementing the exception statement input language over the first-way of implementation, can be shown even more dramatically when the circuit to be analyzed is comprised of large busses as shown in FIGS. 13 and 14.

FIGS. 13 and 14 depict the same circuit. The circuit is comprised of two 32-bit launch registers 1300 and 1301 which are both driven by "CLK1." The 32-bit operands from 1300 and 1301 are fed to a 32-bit adder 1304 which produces a 33-bit output. The 33-bit output of adder 1304 is stored in 33-bit capture register 1302. The 32-bit operands from 1300 and 1301 are fed into a 32-bit array multiplier 1305 which produces a 64-bit output. The 64-bit output of array multiplier 1305 is stored in 64-bit capture register 1303. The 32-bit bus output from 1300 is called "L1," and the individual wires of that bus are referred to as L1[1], L1[2], ... L1[32], where L1[1] is the least significant bit and L1[32] is the most significant bit. The 32-bit bus output from 1301 is called "L2," and the individual wires of that bus are likewise referred to as L2[1], L2[2], ... L2[32], where L2[1] is the least significant bit and L2[32] is the most significant bit. The 64-bit bus input to 1303 is called "C2," and the individual wires of that bus are referred to as C2[1], C2[2], ... C2[64], where C2[1] is the least significant bit and C2[64] is the most significant bit.

The following input exception statement, example (10), has been specified by the circuit designer:

set_multicycle_path 2 -from {L1[1] L1[2] ... L1[32]

L2[1] L2[2] ... L2[32]}\

-to {C2[1]C2[2] ... C2[64]}; (10)

This exception statement might be utilized because the circuit designer knows that he or she will be allowing more time for multiplication than addition.

Assume that for FIG. 13 a full propagation of RF timing tables has been done, to implement example (10), in accordance with the above-described first-way of implementing the exception statement input language.

The region surrounding the 32 output pins of launch register 1300 is shown in magnified form as region 1306. As can be seen, each of the 32 output pins of 1300 points to its own RF timing table, and each of those 32 RF timing tables will have a tag of a different type. For example, the output pin of L1[1] points to an RF timing table 1308 whose tag 1309 holds the label "L1[1]" in its second part 1310. Output pin of L1[32] points to an RF timing table 1311 whose tag 1312 holds the label "L1[32]" in its second part 1313. Although it is not shown in FIG. 13, a similar set of 32 RF timing tables exists for the 32 output pins of bus L2 from launch register 1301. In particular, each wire L2[1], L2[2], ... L2[32] has its own output pin which points to its own RF timing table.

The region surrounding the 64 input pins of capture register 1303 is shown in magnified form as region 1307. For each pin of L1 or L2 which can possibly influence a pin C2[n], that pin C2[n] will have an RF timing table. The maximum number of RF timing tables a pin C2[n] can point to, therefore, is 64. In fact, in the case of an array multiplier, the 33 most significant pins of C2 will each point to the worst case of 64 RF timing tables. For C2[64], FIG. 13 partially depicts the 64 RF timing tables its input pin points to by showing tables 1314–1317 where each table has a tag of a different type. Each of the remaining 32 less-significant pins of C2 will also point to a large (though declining) number of RF timing tables.

Assume that for FIG. 14 a full propagation of RF timing tables has been done, to implement example (10), in accordance with the above-described second-way of implementing the exception statement input language.

The region surrounding the 32 output pins of launch register 1300 is shown in magnified form as region 1306. As can be seen, each of the 32 output pins of 1300 points to its own RF timing table, and but each of those 32 RF timing tables will have a tag of the same type. For example, the output pin of L1[1] points to an RF timing table 1400 whose tag 1401 holds the same label in its second part 1402 as does tag 1404 for the RF timing table 1403 pointed to by L1[32]. Although it is not shown in FIG. 14, a similar set of 32 RF timing tables exists for the 32 output pins of bus L2 from launch register 1301. In particular, each wire L2[1], L2[2], ... L2[32] has its own output pin which points to its own RF timing table, and all of those RF timing tables have the same type of tag. Furthermore, the type of tag for the output pins of wires L2[1], L2[2], ... L2[32] are the same as the tag for the output pins of wires L1[1], L1[2], ... L1[32].

Since all the tags on all the output pins of both launch registers are the same, all the input pins for C2 need point to only one RF timing table. FIG. 14 shows the region around the input pins of C2 magnified as region 1307. As can be seen, the pin for most significant bit C2[64] points to only one RF timing table 1406 whose tag 1407 is of the same type as those on all the output pins of both launch registers.

Additional Functionalities

With regard to first-way and second-way modified RF timing table propagation, a special optimization can be performed. This optimization will be described specifically with respect to first-way modified RF timing table propagation to produce an optimized first-way modified RF timing table propagation. However, simply applying the above described changes, for achieving second-way modified RF timing table propagation from first-way modified RF timing table propagation, to optimized first-way modified RF timing table propagation will produce optimized second-way modified RF timing table propagation. The special optimization can be implemented in two main ways.

The first main way to implement the special optimization is as follows. For the second of the three modifications of first-way modified RF timing table propagation from regular RF timing table propagation, if the label being considered for addition to RFTT_X's tag, by itself or in conjunction with any selection of labels already on the tag, satisfies the path specification of at least one preprocessed exception statement with a "set_false_path" timing alteration then the following occurs: i) all the labels currently in the second part of RFTT_X's tag are erased and replaced with a special label, which we shall refer to as FALSE_PATH, that indicates that the paths represented by RFTT_X satisfy a "set_false_path" timing alteration, and ii) the launch clock specified in the first part of RFTT_X's tag is changed to a special identifier, which we shall refer to as FALSE_CLOCK, that indicates that this RF timing table describes paths that satisfy a "set_false_path" timing alteration. An extra step of checking is also added when considering a label for addition to RFTT_X's tag in the second of three modifications from regular RF timing table propagation. Specifically, if RFTT_X's tag already contains the FALSE_PATH label, then there is automatically no addition to the tag of the label indicated by PIN_X when PIN_X is marked with an exception flag. A change also needs to be made to the above-described first change of relative constraint analysis to produce first-way modified relative constraint analysis. For each RF timing table C_FF1_RF_TABLE looped over by LOOP5, if its tag contains the FALSE_PATH label, then the chosen timing alteration C_FF1_RF_TABLE_TA is automatically "set_false_path." The net effect of these changes is to make all RF timing tables, whose path's satisfy a "set_false_path" timing alteration, of the same type. This saves memory by reducing the number of RF timing tables to be propagated.

The second main way to implement the special optimization is as follows. For the second of the three modifications of first-way modified RF timing table propagation from regular RF timing table propagation, if the label being considered for addition to RFTT_X's tag, by itself or in conjunction with any selection of labels already on the tag, satisfies the path specification of at least one preprocessed exception statement with a "set_false_path" timing alteration then RFTT_X can be discarded by removing PIN_X's reference to it. RFTT_X can be discarded since there is no longer any question that the paths it represents will meet the timing requirements as modified by "set_false_path." A reason to implement the first way of implementing the special optimization, rather than this simpler second way, is for reporting purposes. Specifically, once the RF timing tables with the FALSE_PATH label reach the inputs to the capture flip flops, their contents, with regard to rise and fall times, could be reported to the circuit designer.

These first and second ways of implementing the special optimization can be done because "set_false_path" has the highest precedence amongst the timing alterations.

The timing arc has been defined above as a function timing_arc$_k$(a,b) whose two inputs are defined as follows: i) input "a" takes the direction of an edge being applied to input$_k$ and ii) input "b" takes the direction of an edge which could be output from gate g. In response to these two inputs, timing_arc$_k$(a,b) has been defined above to output a single value of the delay between the application of the specified input edge and the output of the specified output edge, assuming that the input edge does in fact produce the output edge. If the specified output edge cannot be produced for the specified input edge, then a symbol indicative of this inapplicability is output.

In fact, timing_arc$_k$(a,b) could be defined to output two values of the delay between the application of the specified input edge and the output of the specified output edge. These two values of delay could be used, for example, to achieve a timing analysis which covers a range of operating conditions for the circuit. These two delay values, which we shall refer to as a "delay pair," can be used in the procedures described above, which assume only one delay value being returned from the timing arc's function per set of input edges, as follows. In the procedures described above, a timing arc function is accessed to compute values for an RF timing table, which we shall refer to as the "directly affected RF timing table," that is located at the pin to which the timing arc directly "points." If the timing arc function is being accessed to compute a value for the minRT or minFT of a directly affected RF timing table, then use the minimum of the delay pair. If the timing arc function is being accessed to compute a value for the maxRT or maxFT of a directly affected RF timing table, then use the maximum of the delay pair.

The arguments of pass specifiers, as described above, have either labeled a single pin or an OR of single pins. The exception statement input language, however, can be augmented to accept an arbitrary boolean equation as the argument of a "-through" path specifier. For the case of unordered "-through"s, an arbitrary boolean equation argument can be implemented as follows. The first phase of second-way preprocessing is modified in order to produce intermediate preprocessed exception statements of the same form as described above. The second phase of second-way preprocessing functions in the same manner as described above. The steps following second-way preprocessing, in the performance of a second-way static timing analysis, also function in the same way as described above.

The first phase of second-way preprocessing is modified as follows. An example of the following process is shown in FIG. 15. As can be seen in FIG. 15, the expression of a general boolean equation requires the addition of the AND "*" operator to the language for expressing the argument to a path specifier. In addition, for clarity of expression, is helpful to add an OR symbol such as the "+." Standard boolean equation manipulation algorithms (such as those referred to in FIG. 10) are utilized to convert arguments, which cannot be expressed as a sum of single pins, into a canonical sum-of-products form where the operands of the products are single pins. In general, at this point in the first phase of second-way preprocessing, the path specification for each exception statement is in the form of being a product whose operands may be any selection of the following: i) a single pin, ii) a sum of single pins or iii) sums of products where the operands of the products are single pins. The "cross product" of the path specification for each exception statement, in essentially the same manner as described above, is then computed to produce exception statements whose path specifications are in the form of being a product whose operands may be any selection of the following: i) a single pin or ii) a product of single pins. Those path specifier arguments which are a product of single pins are replaced by a series of separate "-through"s , where each "-through" has a single one of the pins of the former product as its argument. At this point, the input exception statements have been converted into the same canonical form, described above for intermediate exception statements, in which all the exception statements specify a sum-of-products and each individual exception statement path specification is a product of single-pin path specifier arguments.

It has been demonstrated above that second-way pin labeling is desirable over first-way pin labeling because, by recognizing the equivalency of a group of pins for the purposes of satisfying an exception or exceptions, it reduces the number of tag types which result. Reduction of the number of tag types reduces memory requirements, by reducing the number of RF timing tables, and reduces the processing time associated with a greater number of RF timing tables. Second-way pin labeling explicitly describes the establishment of equivalency as a sum of single pins, but this equivalency principle can be established at higher levels of path specification organization.

FIG. 16 illustrates a specific example of higher-level equivalency. First are shown, in FIG. 16, two exception statements with "set_false_path" timing alterations. These two exception statements have already been second-way preprocessed such that its path specifier arguments are ORs of single-pin labels. Next, FIG. 16 depicts a single "pattern-matching" exception statement which reflects the higher-level equivalency between "{Q+Z}*{A+T}" being true and "{N+M}" being true: either being true requires only "{B+G}" to be true in order to satisfy a false path. Notice that an AND operator "*" had to be added to the language for specifying an argument to a path specifier. In addition, for clarity of presentation, it is also helpful to add a specific OR operator symbol, namely "+" Thus the language for expressing an argument to a path specifier must be augmented, as described above, such that a general boolean equation can be expressed. Thus, the formation of the exception statements which reflect a higher level of equivalency require the ability to create multi-level logic expressions as arguments to path specifiers in the set of "pattern matching" exception statements formed from the second-way preprocessed exception statements. This creation of multi-level logic can be accomplished using standard boolean equation manipulation techniques, such as those referenced in FIG. 10.

Second-way node labeling then proceeds in the same manner as described above.

Second-way modified RF timing table propagation, however, proceeds differently. As discussed above, each time an RF timing table RFTT_X is created for a PIN_X, the PIN_X is checked for an argument container. In the discussion above, it is always the case that a label in the argument container for PIN_X could satisfy at least one argument of a path specifier in at least one of the second-way preprocessed exception statements. In the case of implementing higher-level equivalency, however, each label in the argument container for PIN_X is first checked to see If by itself, or in conjunction with other labels already in the tag of table RFTT_X, the argument for a path specifier amongst the pattern matching exception statements is satisfied. The argument satisfied amongst the pattern matching exception statements may be of a higher-level than the label, call it "LABEL_X1" in the argument container of PIN_X, currently being considered for addition to the tag of RFTT_X. If the argument satisfied amongst the pattern matching exception statements is of a higher-level, we shall refer to that satisfied argument as a "super-label." If a super-label, call it "SUPER_X," is satisfied, then LABEL_X will not be added to the tag of RFTT_X, and SUPER_X will be added to the tag instead, unless SUPER_X itself, or in conjunction with other labels already in the tag of table RFTT_X, satisfies an even higher-level super-label amongst the pattern matching exception statements. Depending upon the levels of multi-level logic added to path specifier arguments amongst the pattern matching exception statements, there may be many iterations of a super-label satisfying an even higher super-label until a highest-level super-label is satisfied. The highest-level super-label satisfied will then be added to the tag for RFTT_X, provided that it, by itself or in conjunction with any selection of labels already on the tag, satisfies, or can possibly satisfy, a path specification of at least one of the pattern-matching exception statements. Alternatively, if LABEL_X does not satisfy any super-label, then LABEL_X will then be added to the tag for RFTT_X, provided that it, by itself or in conjunction with any selection of labels already on the tag, satisfies, or can possibly satisfy, a path specification of at least one of the preprocessed exception statements.

With regard to FIG. 16, when an RF timing table is created for pin "N," the label "{N+M}" will be in the argument container of the pin. The label "{N+M}" satisfies the super-label "{ {Q+Z}*{A+T}+{N+M} }" of the pattern matching exception statement, and therefore this super label will be added to the tag of the RF timing table provided that it, by itself or in conjunction with any selection of labels already on the tag, satisfies, or can possibly satisfy, the rest of the path specification of the pattern-matching exception statement. When an RF timing table is created for pin "Q," the label "{Q+Z}" will be in the argument container of the pin. The label "{Q+Z}," by itself, does not satisfy the super-label "{ {Q+Z}*{A+T}+{N+M} }" of the pattern matching exception statement. If the tag for the RF timing table contains "{A+T}," then the super-label is satisfied, and it will be added to the tag provided that it, by itself or in conjunction with any selection of labels already on the tag, satisfies, or can possibly satisfy, the rest of the path specification of the pattern-matching exception statement. If, however, the tag for the RF timing table does not contain "{A+T}," then only the label "{Q+Z}" will be added to the tag provided that it, by itself or in conjunction with any selection of labels already on the tag, satisfies, or can possibly satisfy, a path specification of at least one of the preprocessed exception statements.

Second-way modified relative constraint analysis differs from that described above. Rather than just determining whether the labels in the tag of an RF timing table C_FF1_RF_TABLE satisfies a subset of the preprocessed exception statements, a determination is also made as to which subset of pattern-matching exception statements are satisfied. Then, according to the precedence rules described above, a single timing alteration is applied to the MAPD and/or SAPD under which the values of C_FF1_RF_TABLE are analyzed.

Hardware Environment

Figure 6:
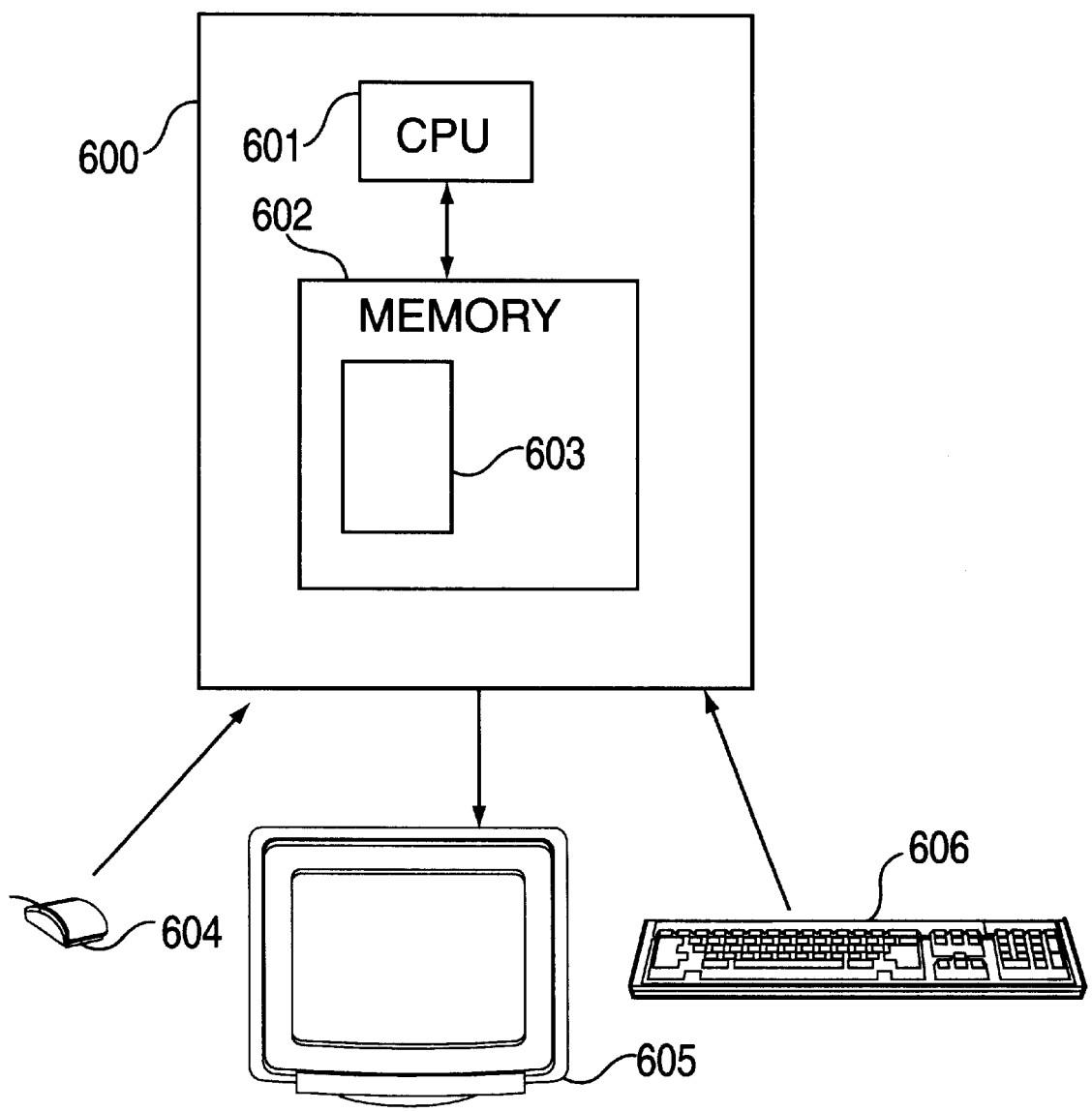
FIG. 6 illustrates the typical hardware computing environment in which the software in accordance with a preferred embodiment of the present invention is executed.

Typically, the timing analysis architecture of the present invention is executed within the computing environment (or data processing system) such as that of FIG. 6. FIG. 6 depicts a workstation computer 600 comprising a Central Processing Unit (CPU) 601 (or other appropriate processor or processors) and a memory 602. Memory 602 has a portion of its memory in which is stored the software tools and data of the present invention. While memory 603 is depicted as a single region, those of ordinary skill in the art will appreciate that, in fact, such software may be distributed over several memory regions or several computers. Furthermore, depending upon the computer's memory organization (such as virtual memory), memory 602 may comprise several types of memory (including cache, random access memory, hard disk and networked file server). Computer 600 is typically equipped with a display monitor 605, a mouse pointing device 604 and a keyboard 606 to provide interactivity between the software of the present invention and the chip designer. Computer 600 also includes a way of reading computer readable instructions from a computer readable medium 607, via a medium reader 608, into the memory 602. Computer 600 also includes a way of reading computer readable instructions via the Internet (or other network) through network interface 609.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method performed in a circuit analysis process, comprising the steps performed by a data processing system of:

marking certain points in a circuit description according to their being referenced by at least a first exception;

propagating a plurality of timing tables through the circuit description; and wherein at least a first timing table, of the plurality of timing tables, refers to a tag comprising at least a first label indicating a marked point in the circuit description, through which the table has been propagated.

2. The method of claim 1, wherein the first label represents a boolean relationship amongst several marked circuit points.

3. The method of claim 2, wherein the first label represents a boolean OR relationship amongst several marked circuit points.

4. The method of claim 1, further comprising:

comparing a first timing value of the first timing table to a first constraint value.

5. The method of claim 4, further comprising:

satisfying an exception, prior to comparing the first timing value, with the first label.

6. The method of claim 5, further comprising:

modifying the first constraint value, prior to comparing it to the first timing value, according to the satisfied exception.

7. The method of claim 1, wherein a point in the circuit description is a pin.

8. The method of claim 1, wherein a point in the circuit description is a node.

9. The method of claim 1, further comprising:

preprocessing at least a first input exception, prior to marking certain points, to produce at least the first exception.

10. The method of claim 1, wherein the first exception includes a boolean OR relationship amongst several marked circuit points.

11. The method of claim 9, wherein the first exception includes a boolean OR relationship amongst several marked circuit points.

12. The method of claim 1, wherein the step of propagating further comprises:

determining that a second path specification of a second exception is satisfied with the first label; and substituting a first special symbol, indicative of a second timing alteration of the second exception, for at least the first label comprising the tag.

13. The method of claim 1, wherein the step of propagating further comprises:

determining that a second argument of a second path specification of a second exception is satisfied with the first label; and substituting the second argument, indicative of a higher level boolean relationship among marked circuit points than the first label, for at least the first label comprising the tag.

* * * * *